United States Patent
Wang

(10) Patent No.: US 8,154,847 B2
(45) Date of Patent: Apr. 10, 2012

(54) CAPACITOR STRUCTURE

(75) Inventor: Yu-Jen Wang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 877 days.

(21) Appl. No.: 12/209,210

(22) Filed: Sep. 12, 2008

(65) Prior Publication Data

US 2010/0067169 A1 Mar. 18, 2010

(51) Int. Cl.
*H01G 4/005* (2006.01)
*H01G 4/06* (2006.01)

(52) U.S. Cl. ............................. 361/303; 361/311
(58) Field of Classification Search ................. 361/303, 361/311

See application file for complete search history.

(56) References Cited

U.S. PATENT DOCUMENTS

| | | | | |
|---|---|---|---|---|
| 6,614,645 | B1 * | 9/2003 | Sakurai et al. | 361/328 |
| 7,456,462 | B1 * | 11/2008 | Heshami et al. | 257/307 |
| 7,545,022 | B2 * | 6/2009 | Chen et al. | 257/532 |
| 7,612,984 | B2 * | 11/2009 | Chen et al. | 361/311 |
| 7,923,817 | B2 * | 4/2011 | Chen et al. | 257/532 |
| 2005/0189614 | A1 * | 9/2005 | Ihme et al. | 257/532 |
| 2008/0099879 | A1 * | 5/2008 | Chen et al. | 257/532 |
| 2008/0108201 | A1 * | 5/2008 | Ihme et al. | 438/393 |
| 2009/0212392 | A1 * | 8/2009 | Chen et al. | 257/532 |

* cited by examiner

*Primary Examiner* — Eric Thomas
(74) *Attorney, Agent, or Firm* — Winston Hsu; Scott Margo

(57) ABSTRACT

A capacitor structure is disclosed. The capacitor structure includes at least a $D1_+$ first-level array. The $D1_+$ first-level array comprises three first $D1_+$ conductive pieces and a second $D1_+$ conductive piece. Two of the first $D1_+$ conductive pieces are disposed in a first row of the $D1_+$ first-level array, and the remaining first $D1_+$ conductive piece and the second $D1_+$ conductive piece are disposed in a second row of the $D1_+$ first-level array from left to right. The adjacent first $D1_+$ conductive pieces are connected to each other, and the first $D1_+$ conductive pieces are not connected to the second $D1_+$ conductive piece.

35 Claims, 21 Drawing Sheets

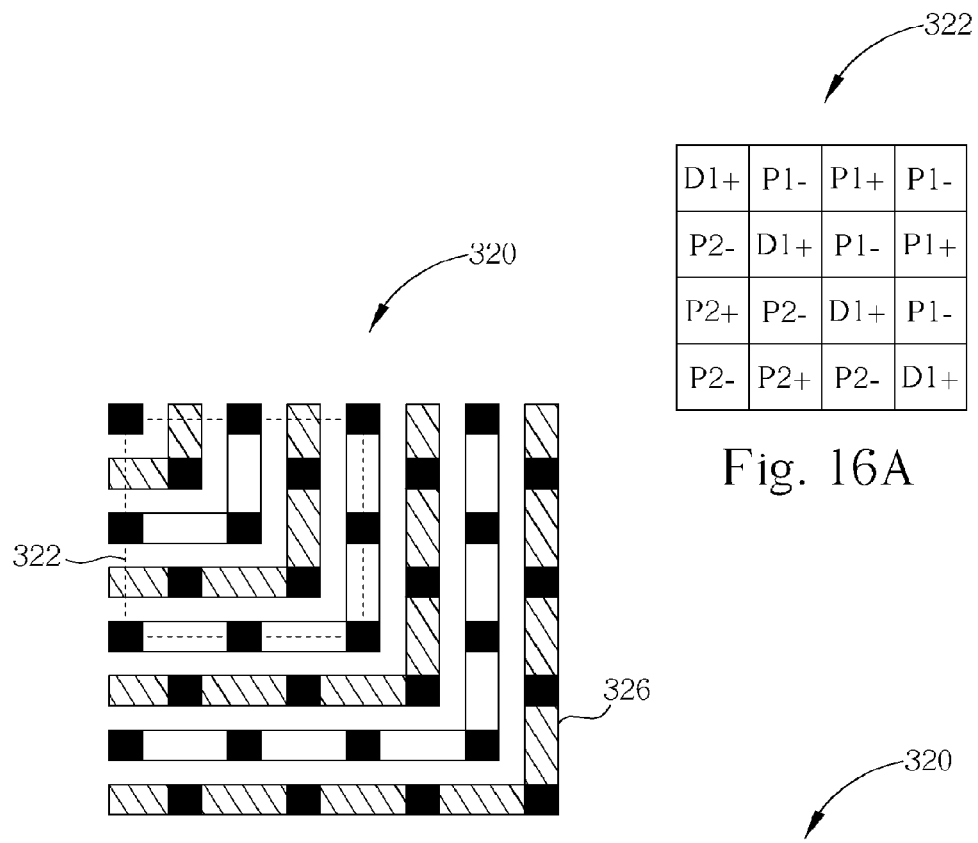
Fig. 16A
Fig. 16B
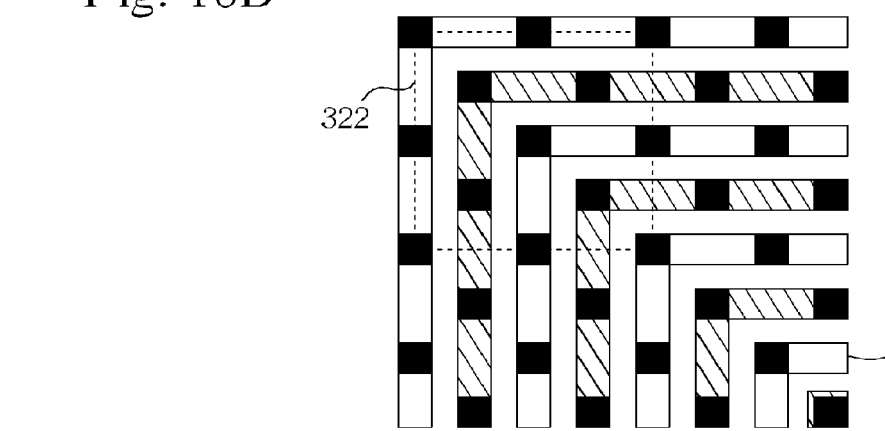
Fig. 16C

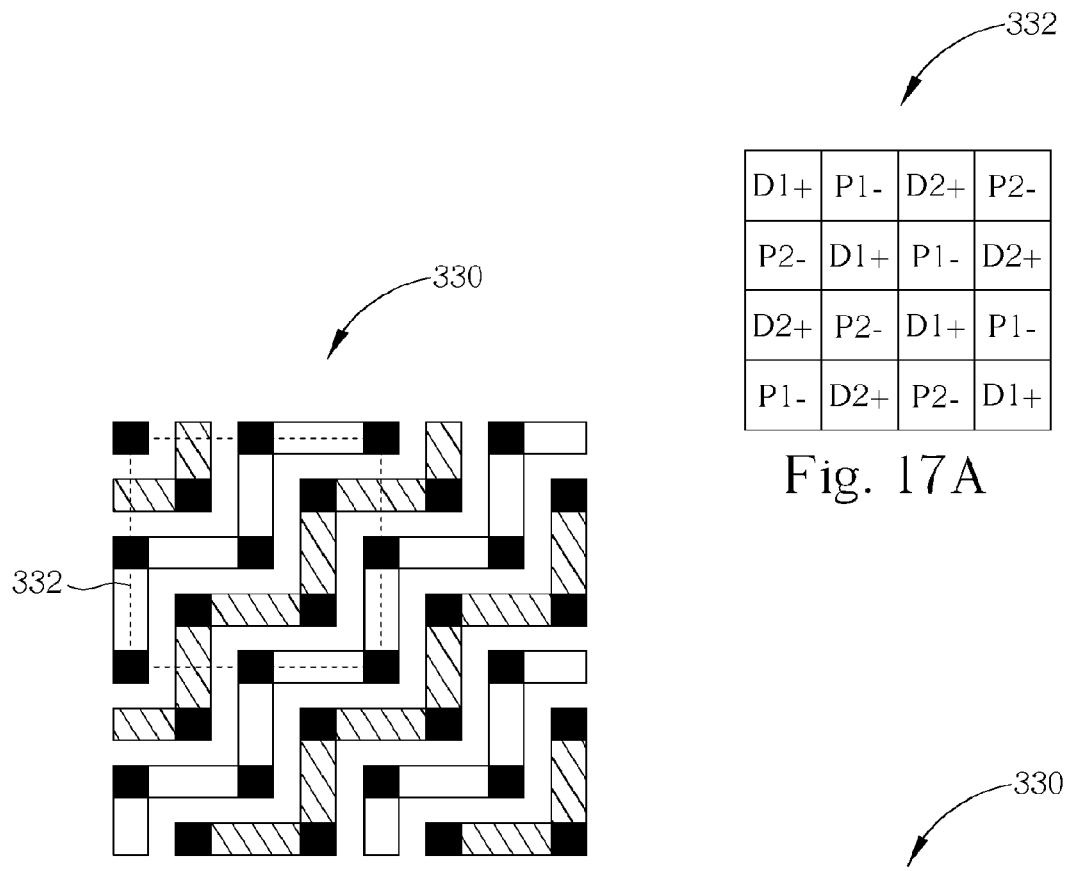
Fig. 17A
Fig. 17B
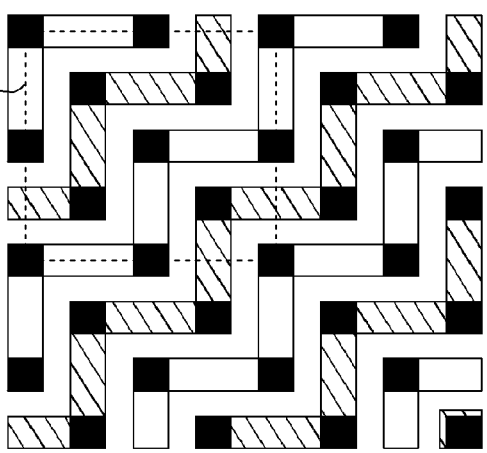
Fig. 17C

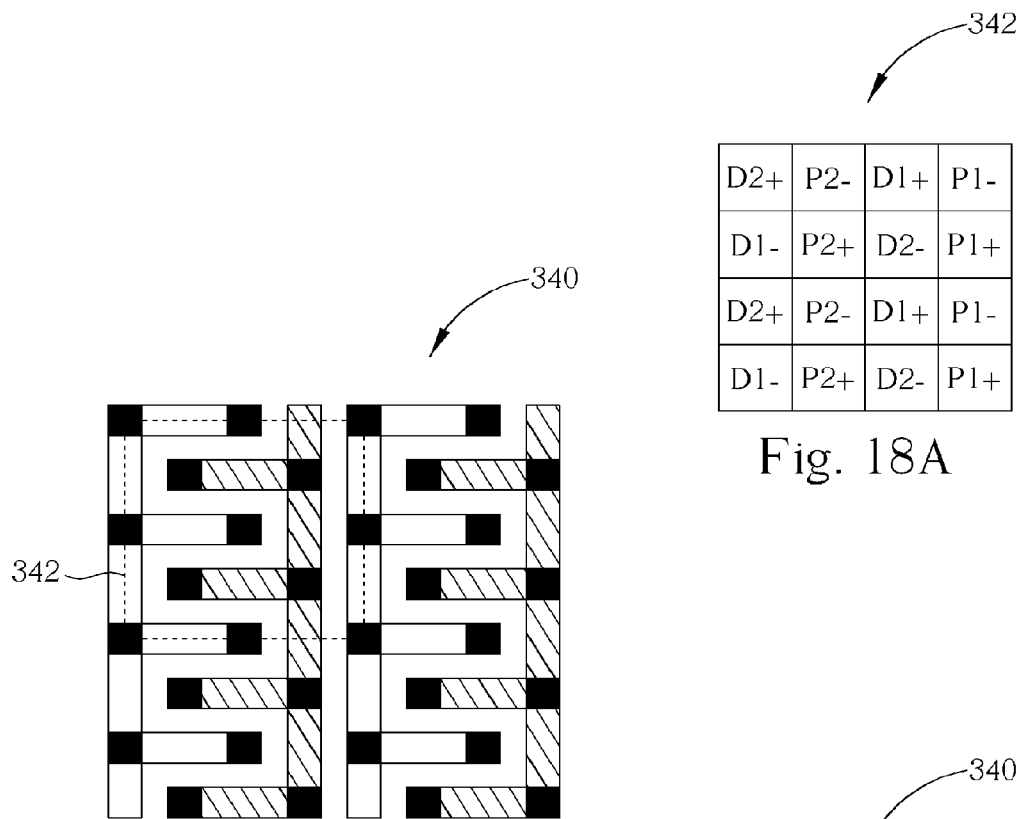
Fig. 18A
Fig. 18B
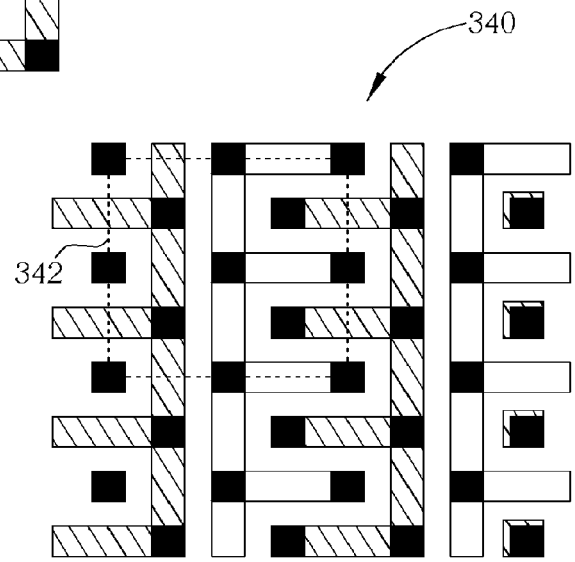
Fig. 18C

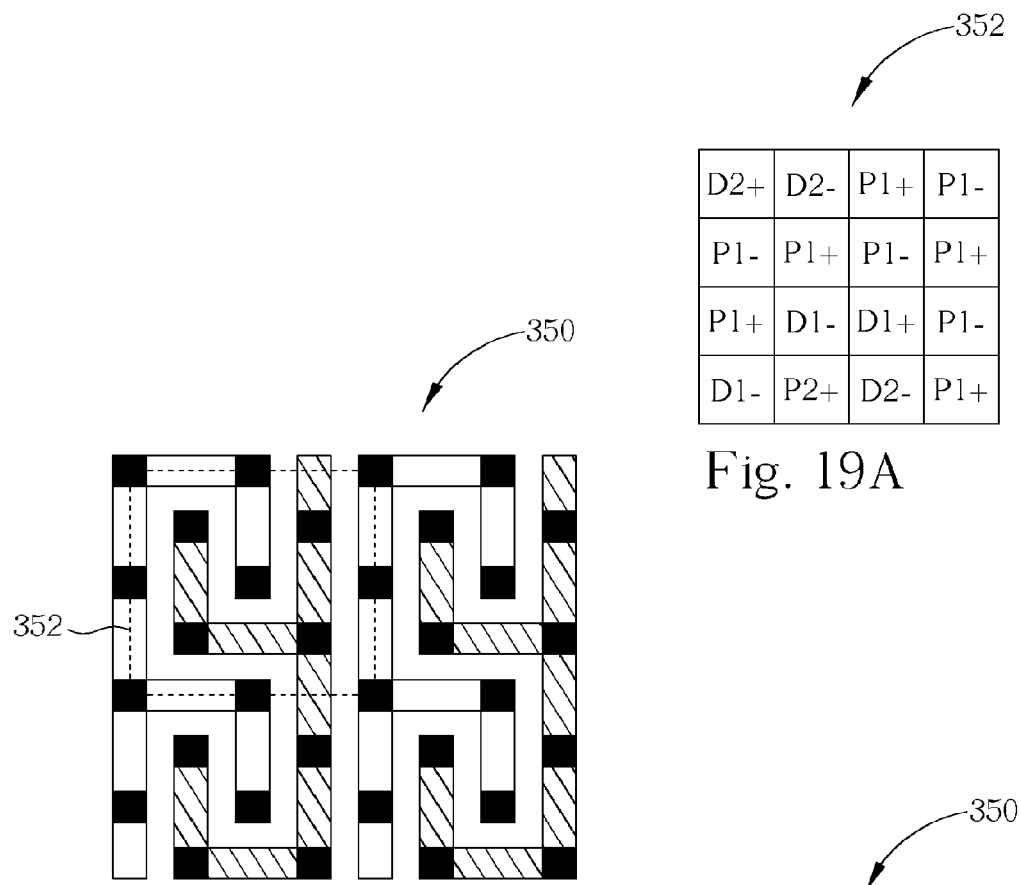
Fig. 19A
Fig. 19B
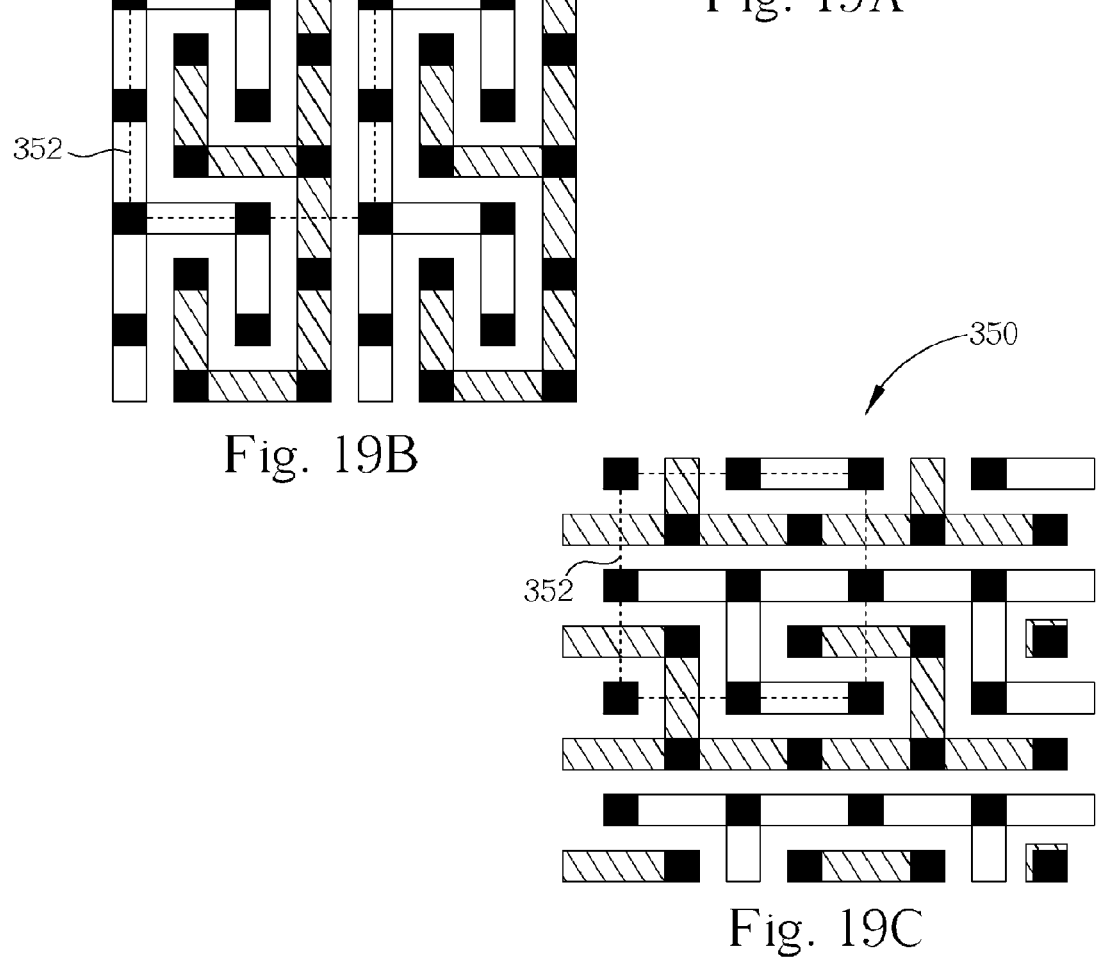
Fig. 19C

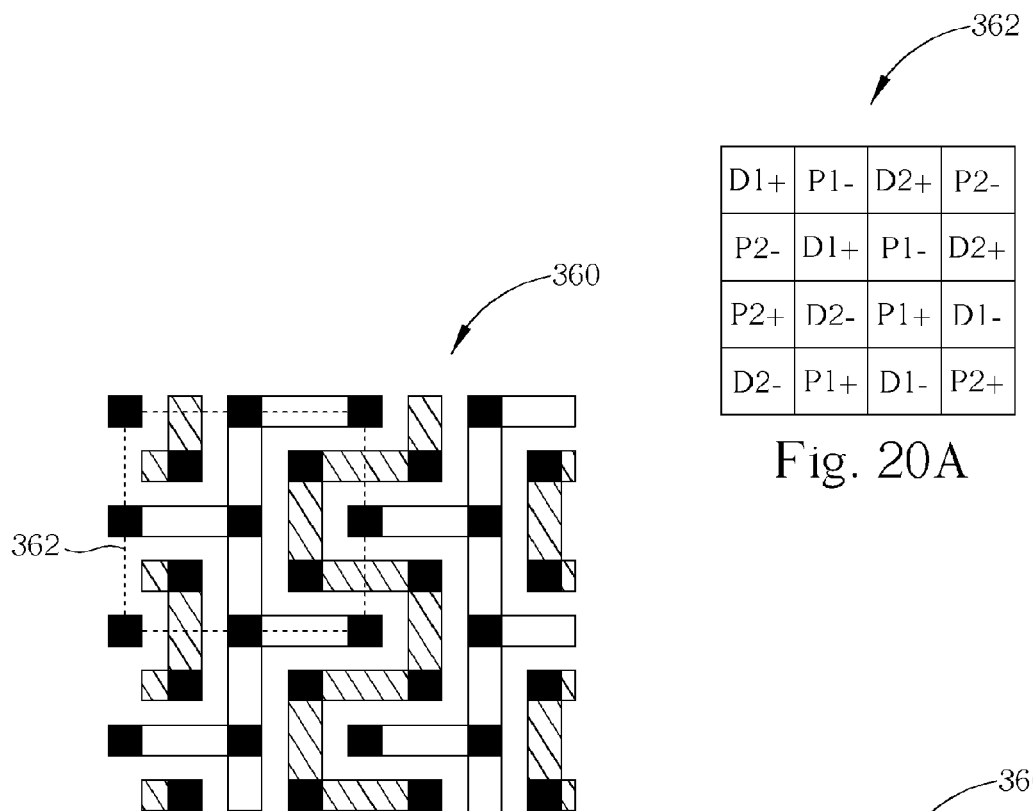
Fig. 20A
Fig. 20B
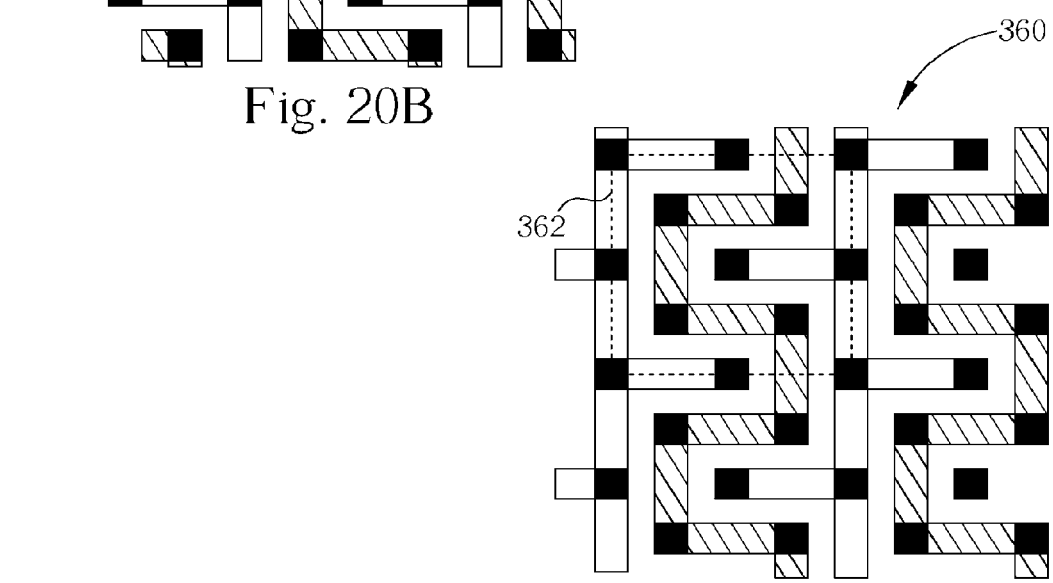
Fig. 20C

CAPACITOR STRUCTURE

BACKGROUND OF THE INVENTION

1. Field of the Invention

The present invention relates to a capacitor structure, and more particularly, to a capacitor structure having high performance and high yield.

2. Description of the Prior Art

In semiconductor integrated circuits (ICs), a semiconductor capacitor may be implemented to provide a capacitive component within the design of a semiconductor integrated device. The applications for these capacitors can include mixed signal (analog/digital) devices, RF (radio frequency) devices, and even decoupling capacitors for the filtering of high frequency signals and improved noise immunization.

One type of semiconductor capacitor structure, called the metal-oxide-metal (MOM) capacitor structure, is commonly used in silicon based semiconductor integrated circuits for its versatility and consistency in reproduction in semiconductor processing. Basically, an MOM capacitor structure includes two parallel electrode plates and an insulator disposed between the electrode plates. With reference to FIG. 1, FIG. 1 is a schematic diagram of a flat plate capacitor structure 10 according to the related art. As shown in FIG. 1, the flat plate capacitor structure 10 includes a substrate 12, a first electrode plate 14 disposed on the substrate 12, a capacitor dielectric layer 16 disposed on the first electrode plate 14, and a second electrode plate 18 disposed on the capacitor dielectric layer 16.

The capacitance of a capacitor structure can be expressed as Eq (1):

$$C \approx \in A/d \qquad \text{Eq (1)}$$

Where

C denotes the capacitance;

$\in$ denotes the dielectric constant of the capacitor dielectric layer;

d denotes the thickness of the capacitor dielectric layer; and

A denotes the overlapping area of the first and second electrode plates.

The capacitance of the flat plate capacitor structure 10 is mainly determined by the dielectric constant of the capacitor dielectric layer 16, the thickness of the capacitor dielectric layer 16, and the overlapping area of the first electrode 14 and the second electrode plate 18. In other words, in order to improve the capacitance, these three factors need to be changed.

Since the dielectric layer 16 has to be compatible with the material of the first electrode plate 14 and the second electrode plate 18, there is not much room to improve the capacitance by tuning the dielectric. In addition, an excess thinness of the capacitor dielectric layer 16 may lead to a low breakdown voltage problem. Thus, increasing the overlapping area of the first electrode plate 14 and the second electrode plate 18 is preferred. However, since the first electrode plate 14, the capacitor dielectric layer 16, and the second electrode plate 18 are stacked up vertically, the overlapping area of the first electrode plate and second electrode plate per unit volume of the flat plate capacitor structure 10 is limited. In order to increase the capacitance by means of increasing the overlapping area, the first electrode plate 14 and the second electrode plate 18 should be formed with a large area. Therefore, the integration of integrated circuits is greatly reduced by the prior art flat plate capacitor structure 10.

SUMMARY OF THE INVENTION

An objective of the present invention is therefore to provide an MOM capacitor structure having high performance and high yield to solve the above problems.

According to an exemplary embodiment of the claimed invention, a capacitor structure is disclosed. The capacitor structure comprises a conducting array, and the conducting array comprises a $D1_+$ first-level array. The $D1_+$ first-level array comprises three first $D1_+$ conductive pieces and a second $D1_+$ conductive piece. Two of the first $D1_+$ conductive pieces are disposed in a first row of the $D1_+$ first-level array, and the remaining first $D1_+$ conductive piece and the second $D1_+$ conductive piece are disposed in a second row of the $D1_+$ first-level array from left to right. The adjacent first $D1_+$ conductive pieces connect to each other, and the first $D1_+$ conductive pieces are not connected to the second $D1_+$ conductive piece.

According to another exemplary embodiment of the claimed invention, a capacitor structure is disclosed. The capacitor structure comprises a $D1_+$ block array, and the $D1_+$ block array comprises a $D1_+$ first-level array, a $D1_+$ second-level array positioned above the $D1_+$ first-level array, and a plurality of contact plugs. The $D1_+$ first-level array comprises three first $D1_+$ lower conductive pieces and a second $D1_+$ lower conductive piece. Two of the first $D1_+$ lower conductive pieces are disposed in a first row of the $D1_+$ first-level array, and the remaining first $D1_+$ lower conductive piece and the second $D1_+$ lower conductive piece are disposed in a second row of the $D1_+$ first-level array from left to right. The adjacent first $D1_+$ lower conductive pieces connect to each other, and the first $D1_+$ lower conductive pieces are not connected to the second $D1_+$ lower conductive piece. The $D1_+$ second-level array comprises a first $D1_+$ upper conductive piece and three second $D1_+$ upper conductive pieces. The first $D1_+$ upper conductive piece and one of the second $D1_+$ upper conductive pieces are disposed in a first row of the $D2_+$ second-level array from left to right, and the remaining second $D1_+$ upper conductive pieces are disposed in a second row of the $D2_+$ second-level array. The adjacent second $D1_+$ upper conductive pieces connect to each other, and the first $D1_+$ upper conductive piece is not connected to the second $D1_+$ upper conductive pieces. The contact plugs connect the first $D1_+$ lower conductive pieces with the first $D1_+$ upper conductive piece, and connect the second $D1_+$ lower conductive piece with the second $D1_+$ upper conductive pieces.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 16A, FIG. 16B and FIG. 16C schematically illustrate capacitor structures according to a twentieth-first embodiment respectively of the present invention.

FIG. 17A, FIG. 17B and FIG. 17C schematically illustrate capacitor structures according to a twentieth-second embodiment respectively of the present invention.

FIG. 18A, FIG. 18B and FIG. 18C schematically illustrate capacitor structures according to a twentieth-third embodiment respectively of the present invention.

FIG. 19A, FIG. 19B and FIG. 19C schematically illustrate capacitor structures according to a twentieth-fourth embodiment respectively of the present invention.

FIG. 20A, FIG. 20B and FIG. 20C schematically illustrate capacitor structures according to a twentieth-fifth embodiment respectively of the present invention.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention provides an MOM capacitor structure having a large overlapping area between two electrodes per volume of the capacitor structure, so the layout area of the capacitor structure is reduced. In addition, the capacitor structure in the present invention has a proper layout and proper contact plugs, so the performance and the yield of the capacitor structure are improved. Further description is given as below.

Figure 1:
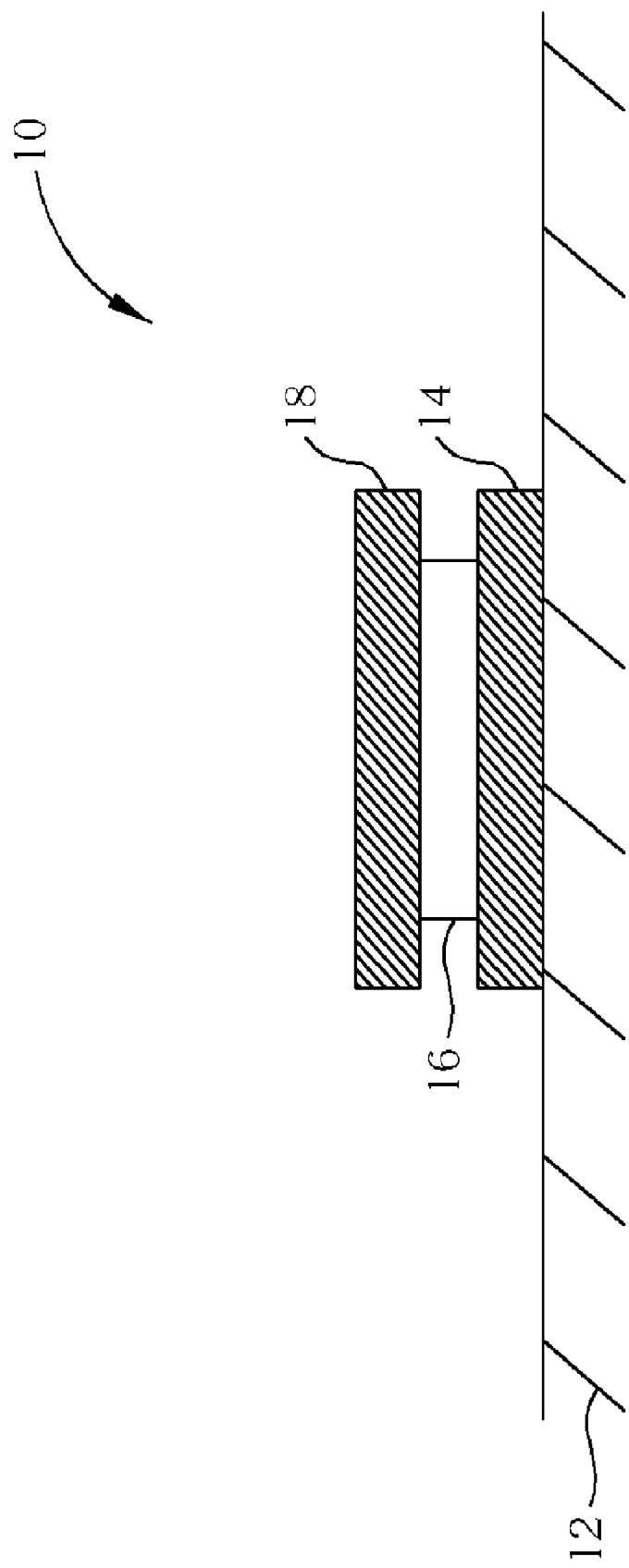
FIG. 1 is a schematic diagram of a flat plate capacitor structure according to the related art.
Figure 2A:
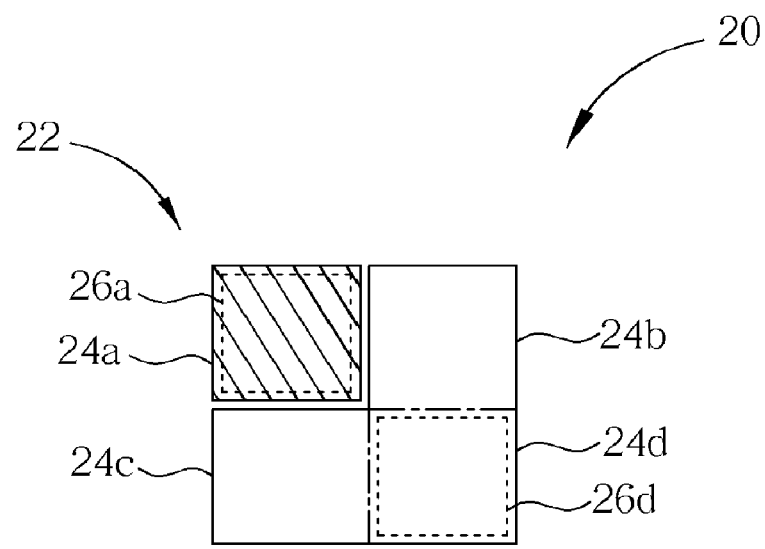
FIG. 2A and FIG. 2B schematically illustrate a capacitor structure according to a first embodiment of the present invention.
Figure 2B:
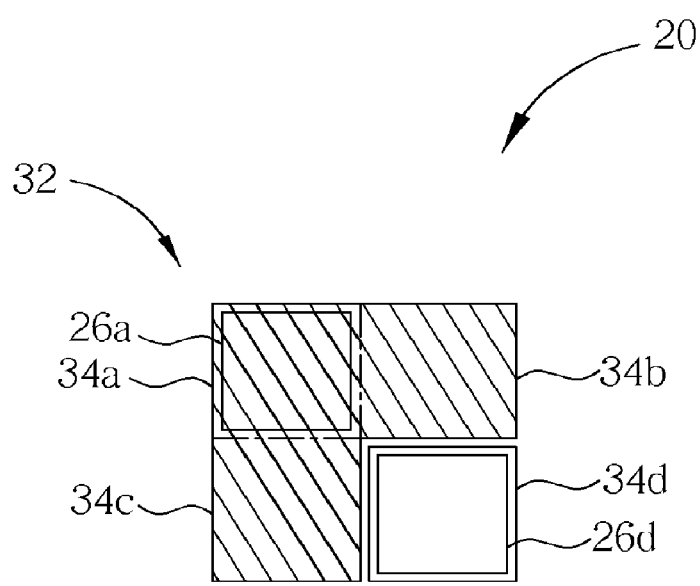

Please refer to FIG. 2A and FIG. 2B. FIG. 2A and FIG. 2B schematically illustrate a capacitor structure 20 according to a first embodiment of the present invention. As shown in FIG. 2A and FIG. 2B, the capacitor structure 20 includes a $D1_+$ block array, and the $D1_+$ block array includes a $D1_+$ first-level array 32, a $D1_+$ second-level array 22 positioned above the $D1_+$ first-level array 32, and a plurality of $D1_+$ contact plugs 26a, 26d. The $D1_+$ first-level array 32 includes three first $D1_+$ lower conductive pieces 34a, 34b, 34c and a second $D1_+$ lower conductive piece 34d. The first $D1_+$ lower conductive pieces 34a, 34b are disposed in a first row of the $D1_+$ first-level array 32, and the first $D1_+$ lower conductive piece 34c and the second $D1_+$ lower conductive piece 34d are disposed in a second row of the $D1_+$ first-level array 32 from left to right. It should be noted that the adjacent first $D1_+$ lower conductive pieces 34a, 34b and 34c are connected to each other, and the first $D1_+$ lower conductive pieces 34a, 34b and 34c are not connected to the second $D1_+$ lower conductive piece 34d. The $D1_+$ second-level array 22 includes a first $D1_+$ upper conductive piece 24a and three second $D1_+$ upper conductive pieces 24b, 24c, 24d. The first $D1_+$ upper conductive piece 24a and the second $D1_+$ upper conductive piece 24b are disposed in a first row of the $D1_+$ second-level array 22 from left to right, and the second $D1_+$ upper conductive pieces 24c, 24d are disposed in a second row of the $D1_+$ second-level array 22. It should be noted that the adjacent second $D1_+$ upper conductive pieces 24b, 24c and 24d are connected to each other, and the first $D1_+$ upper conductive piece 24a is not connected to the second $D1_+$ upper conductive pieces 24b, 24c and 24d.

The $D1_+$ contact plug 26a connects the first $D1_+$ lower conductive piece 34a and the first $D1_+$ upper conductive piece 24a, is positioned corresponding to the first row and a first column of the $D1_+$ first-level array 32 and of the $D1_+$ second-level array 22, and connects the first $D1_+$ lower conductive pieces 34a, 34b, 34c with the first $D1_+$ upper conductive piece 24a. The $D1_+$ contact plug 26d connects the second $D1_+$ lower conductive piece 34d and the second $D1_+$ upper conductive piece 24d, and is positioned corresponding to the second row and a second column of the $D1_+$ first-level array 32 and of the $D1_+$ second-level array 22. The $D1_+$ contact plug 26d connects the second $D1_+$ lower conductive piece 34d with the second $D1_+$ upper conductive pieces 24b, 24c and 24d.

It should be understood by a person skilled in this art that the capacitor structure 20 could have input/output ports (not shown in the figure) for external connections. For example, the first $D1_+$ upper conductive piece 24a and the first $D1_+$ lower conductive pieces 34a, 34b, 34c may be coupled to a first voltage (not shown in the figure), and the second $D1_+$ upper conductive pieces 24b, 24c, 24d and the second $D1_+$ lower conductive piece 34d may be coupled to a second voltage (not shown in the figure). The conductive pieces in the present invention, such as the first $D1_+$ upper conductive piece 24a, the second $D1_+$ upper conductive pieces 24b, 24c, 24d, the first $D1_+$ lower conductive pieces 34a, 34b, 34c and the second $D1_+$ lower conductive piece 34d, can include any conductive materials, such as metal, polycrystalline silicon or a combination thereof. The $D1_+$ contact plugs 26a, 26d and other plugs in the present invention also can include any conductive materials, such as metal, polycrystalline silicon or a combination thereof. The said plug can be a compound structure including any conductive elements between the two connected conducting arrays. For example, if the first-level array and the second-level array is a third metal layer and a fifth metal layer respectively, the related contact plugs can be compound structures including the plugs between the third metal layer and the fourth metal layer, and the plugs between the fourth metal layer and the fifth metal layer.

Furthermore, the conductive pieces 24a, 24b, 24c, 24d, 34a, 34b, 34c and 34d are all regular conductive pieces in this figure, but the applied shapes of the conductive pieces are not limited to what is shown in this figure. Other polygonal conductive pieces or irregular conductive pieces can also be applied. The capacitor structure 20 further include a dielectric layer (not shown in the figure) sandwiched between these conductive pieces 24a, 24b, 24c, 24d, 34a, 34b, 34c, 34d, and material of the dielectric layer can be silicon oxide, silicon nitride, silicon oxynitride or a combination thereof.

The capacitor structure 20 in this embodiment is a two-layer structure. One layer includes the $D1_+$ first-level array 32, and another layer includes the $D1_+$ second-level array 22. However, it is appreciated that the capacitor structure is not limited to a two-layer structure, and all capacitor structures of the present invention can be a single-layer structure, a two-layer structure or a multi-layer structure. For instance, the $D1_+$ first-level array 32 or the $D1_+$ second-level array 22 can form a single-layer structure of a capacitor structure. For a multi-layer structure, the layout pattern of an odd layer can be identical to the D1+ first-level array 32, and the layout pattern of an even layer can be identical to the D1+ second-level array 22.

In case of a two-layer structure or a multi-layer structure, the first-level array and the second-level array can be two adjacent conducting layers, which sandwich a dielectric layer, or two non-adjacent conducting layers, which sandwich a plurality of dielectric layers. For example, the first-level array and the second-level array can be a third metal layer and a fourth metal layer next to the third metal layer respectively, or can be a third metal layer and a sixth metal layer respectively to sandwich a plurality of dielectric layers.

Figure 3A:
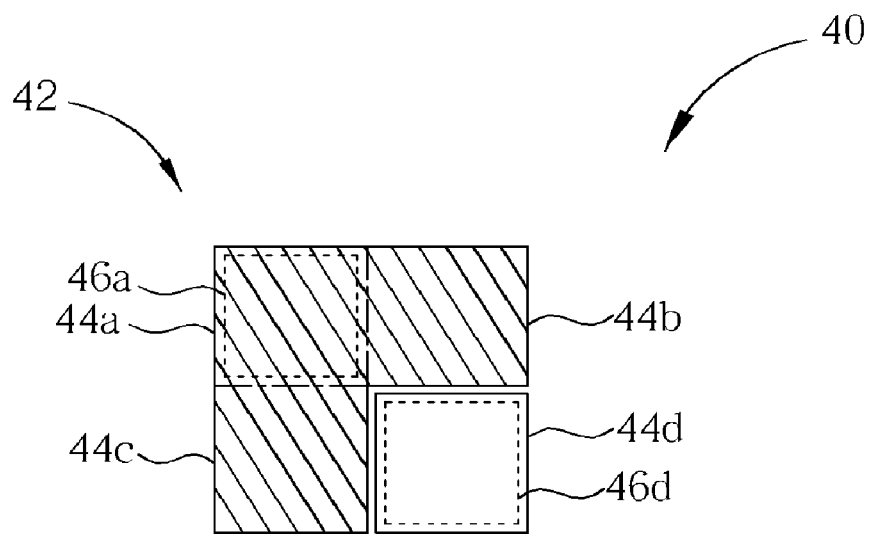
FIG. 3A and FIG. 3B schematically illustrate a capacitor structure according to a second embodiment of the present invention.
Figure 3B:
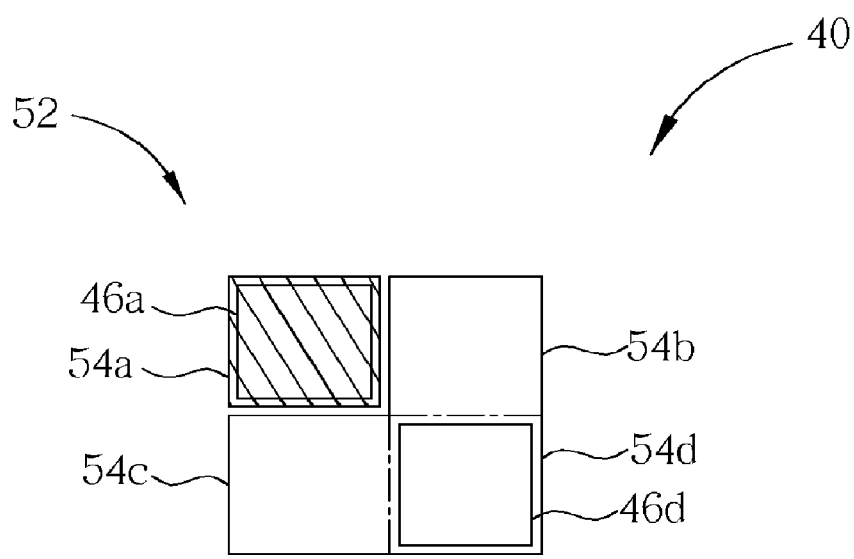

The capacitor structure in the present invention can include block arrays having other arrangements. Please refer to FIG. 3A and FIG. 3B. FIG. 3A and FIG. 3B schematically illustrate a capacitor structure 40 according to a second embodiment of the present invention. As shown in FIG. 3A and FIG. 3B, the capacitor structure 40 includes a diagonal-second-major ($D2_+$) block array, and the $D2_+$ block array includes a $D2_+$ first-level array 52, a $D2_+$ second-level array 42 positioned above the $D2_+$ first-level array 52, and a plurality of $D2_+$ contact plugs 46a, 46d. The $D2_+$ first-level array 52 includes three second $D2_+$ lower conductive pieces 54b, 54c, 54d and a first $D2_+$ lower conductive piece 54a. The first D2+ lower conductive piece 54a and the second $D2_+$ lower conductive piece 54b are disposed in a first row of the $D2_+$ second-level array 52 from left to right. The second $D2_+$ lower conductive pieces 54c and 54d are disposed in a second row of the $D2_+$ second-level array 52. It is worth noting that the adjacent second $D2_+$ lower conductive pieces 54b, 54c and 54d are connected to each other, and the first $D2_+$ lower conductive piece 54a is not connected to the second $D2_+$ lower conductive pieces 54b, 54c and 54d.

The $D2_+$ second-level array 42 includes three first $D2_+$ upper conductive pieces 44a, 44b, 44c and a second $D2_+$ upper conductive piece 44d. The first $D2_+$ upper conductive pieces 44a and 44b are disposed in a first row of the $D2_+$ first-level array 42, and the first $D2_+$ upper conductive piece 44c and the second $D2_+$ upper conductive piece 44d are disposed in a second row of the $D2_+$ first-level array 42 from left to right. The adjacent first $D2_+$ upper conductive pieces 44a, 44b and 44c are connected to each other, and the second $D2_+$ upper 44d conductive piece is not connected to the first $D2_+$ upper conductive pieces 44a, 44b and 44c.

The $D2_+$ contact plug 46a connects the first $D2_+$ lower conductive piece 54a and the first $D2_+$ upper conductive piece 44a, is positioned corresponding to the first row and a first column of the $D2_+$ first-level array 52 and of the $D2_+$ second-level array 42, and connects the first $D2_+$ lower conductive piece 54a with the first $D2_+$ upper conductive pieces 44a, 44b, 44c. The $D2_+$ contact plug 46d connects the second $D2_+$ lower conductive piece 54d and the second $D2_+$ upper conductive piece 44d and is positioned corresponding to the second row and a second column of the $D2_+$ first-level array 52 and of the $D2_+$ second-level array 42. The $D2_+$ contact plug 46d connects the second $D2_+$ lower conductive pieces 54b, 54c and 54d with the second $D2_+$ upper conductive piece 44d.

Figure 4A:
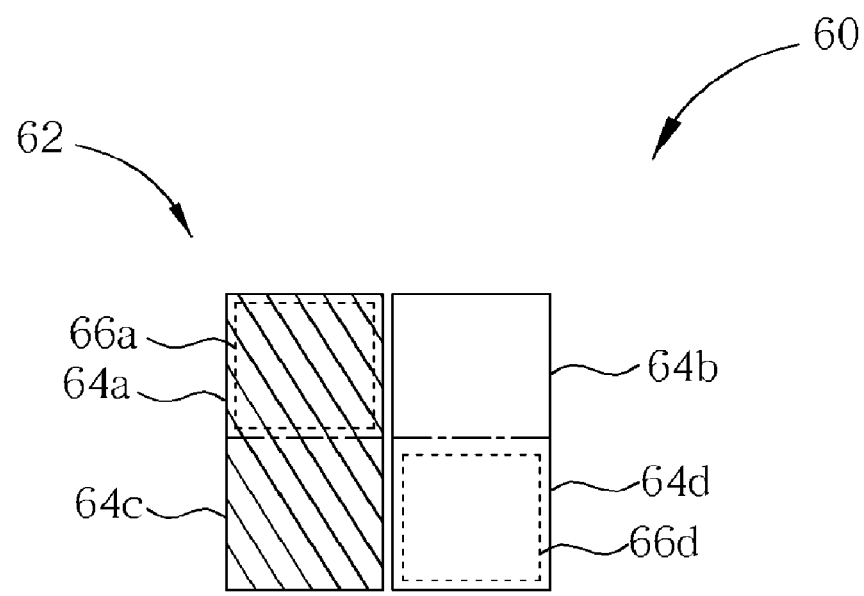
FIG. 4A and FIG. 4B schematically illustrate a capacitor structure according to a third embodiment of the present invention.
Figure 4B:
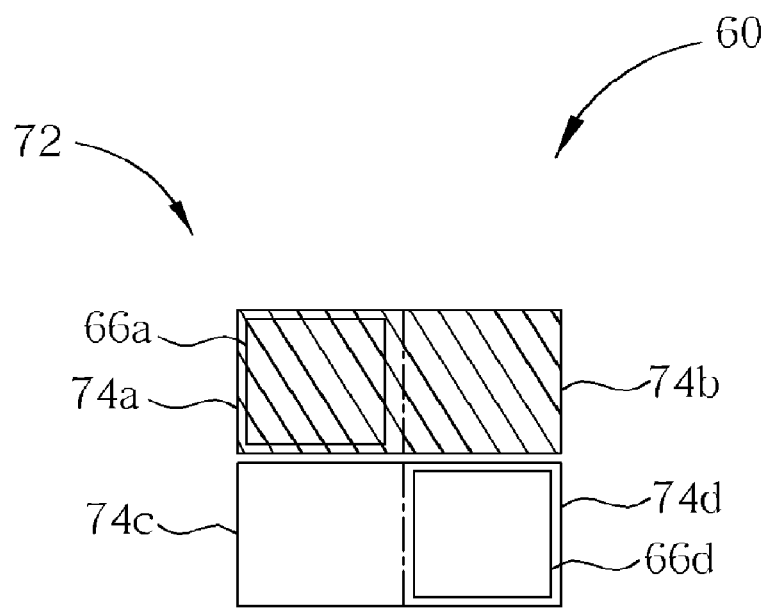

Please refer to FIG. 4A and FIG. 4B. FIG. 4A and FIG. 4B schematically illustrate a capacitor structure 60 according to a third embodiment of the present invention. As shown in FIG. 4A and FIG. 4B, the capacitor structure 60 includes a parallel-first-major ($P1_+$) block array, and the $P1_+$ block array includes a $P1_+$ first-level array 72, a $P1_+$ second-level array 62 positioned above the $P1_+$ first-level array 72, and a plurality of $P1_+$ contact plugs 66a, 66d. The $P1_+$ first-level array 72 includes two first $P1_+$ lower conductive pieces 74a, 74b and two second $P1_+$ lower conductive pieces 74c and 74d. Accordingly, the first $P1_+$ lower conductive pieces 74a and 74b are disposed in a first row of the $P1_+$ first-level array 72, and the second $P1_+$ lower conductive pieces 74c and 74d are disposed in a second row of the $P1_+$ first-level array 72. The adjacent first $P1_+$ lower conductive pieces 74a and 74b are connected to each other, and the adjacent second $P1_+$ lower conductive pieces 74c and 74d are connected to each other. The first $P1_+$ lower conductive pieces 74a and 74b are not connected to the second $P1_+$ lower conductive pieces 74c and 74d.

The $P1_+$ second-level array 62 includes two first $P1_+$ upper conductive pieces 64a, 64c and two second $P1_+$ upper conductive pieces 64b and 64d. The first $P1_+$ upper conductive piece 64a and the second $P1_+$ upper conductive piece 64b are disposed in a first row of the $P1_+$ first-level array 62 from left to right. The first $P1_+$ upper conductive piece 64c and the second $P1_+$ upper conductive piece 64d are disposed in a second row of the $P1_+$ first-level array 62 from left to right. The adjacent first $P1_+$ upper conductive pieces 64a and 64c are connected to each other, and the adjacent second $P1_+$ upper conductive pieces 64b and 64d are connected to each other. The first $P1_+$ upper conductive pieces 64a and 64c are not connected to the second $P1_+$ upper conductive pieces 64b and 64d.

The $P1_+$ contact plug 66a connects the first $P1_+$ lower conductive piece 74a and the first $P1_+$ upper conductive piece 64a, is positioned corresponding to the first row and a first column of the $P1_+$ first-level array 72 and of the $P1_+$ second-level array 62, and connects the first $P1_+$ lower conductive pieces 74a, 74b with the first $P1_+$ upper conductive pieces 64a and 64c. The $P1_+$ contact plug 66d connects the second $P1_+$ lower conductive piece 74d and the second $P1_+$ upper conductive piece 64d and is positioned corresponding to the second row and a second column of the $P1_+$ first-level array 72 and of the $P1_+$ second-level array 62. The $P1_+$ contact plug 66d connects the second P1₊ lower conductive pieces 74c, 74d with the second P1₊ upper conductive pieces 64b, 64d.

Figure 5A:
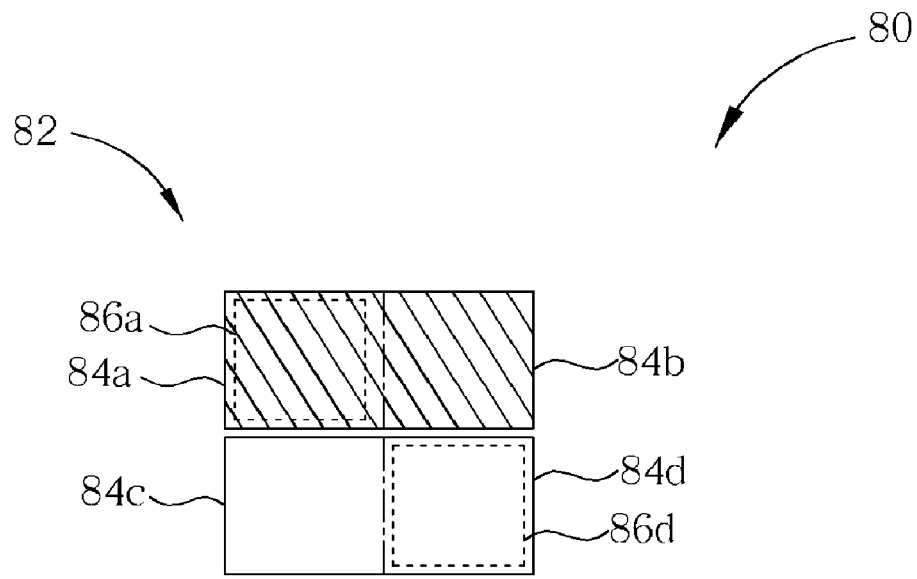
FIG. 5A and FIG. 5B schematically illustrate a capacitor structure according to a fourth embodiment of the present invention.
Figure 5B:
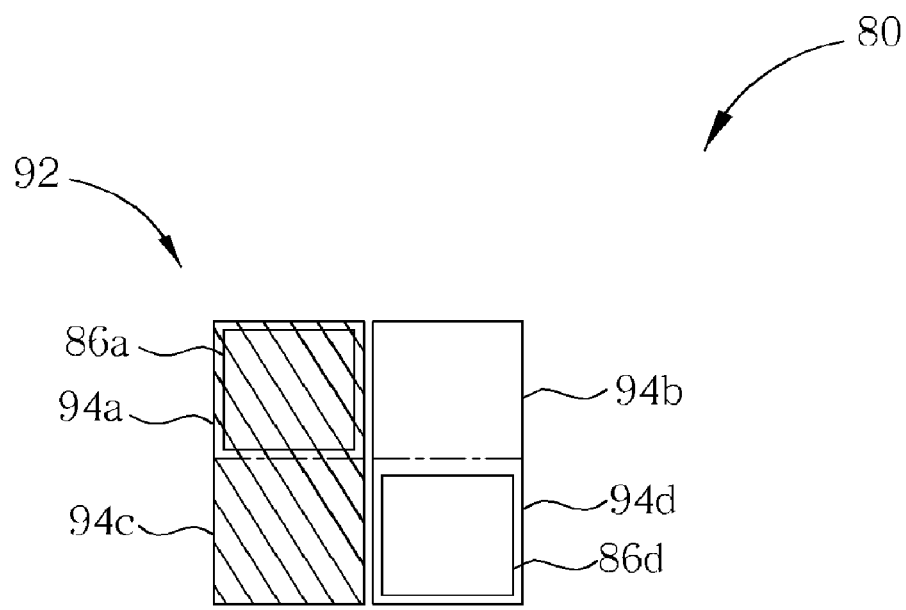

Please refer to FIG. 5A and FIG. 5B. FIG. 5A and FIG. 5B schematically illustrate a capacitor structure 80 according to a fourth embodiment of the present invention. As shown in FIG. 5A and FIG. 5B, the capacitor structure 80 includes a parallel-second-major (P2₊) block array, and the P2₊ block array includes a P2₊ first-level array 92, a P2₊ second-level array 82 positioned above the P2₊ first-level array 92, and a plurality of P2₊ contact plugs 86a, 86d. The P2₊ first-level array 92 includes two first P2₊ lower conductive pieces 94a, 94c and two second P2₊ lower conductive pieces 94b and 94d. Accordingly, the first P2₊ lower conductive piece 94a and the second P2₊ lower conductive piece 94b are disposed in a first row of the P2₊ first-level array 92 from left to right. The first P2₊ lower conductive piece 94c and the second P2₊ lower conductive piece 94d are disposed in a second row of the P2₊ first-level array 92 from left to right. The adjacent first P2₊ lower conductive pieces 94a and 94c are connected to each other, and the adjacent second P2₊ lower conductive pieces 94b and 94d are connected to each other. The first P2₊ lower conductive pieces 94a and 94c are not connected to the second P2₊ lower conductive pieces 94b and 94d.

The P2₊ second-level array 82 includes two first P2₊ upper conductive pieces 84a, 84b and two second P2₊ upper conductive pieces 84c and 84d. The first P2₊ upper conductive pieces 84a and 84b are disposed in a first row of the P2₊ second-level array 82, where the adjacent first P2₊ upper conductive pieces 84a and 84b connect to each other. The second P2₊ upper conductive pieces 84c and 84d are disposed in a second row of the P2₊ second-level array 82, where the adjacent second P2₊ upper conductive pieces 84c and 84d connect to each other. The first P2₊ upper conductive pieces 84a and 84b are not connected to the second P2₊ upper conductive pieces 84c and 84d.

The P2₊ contact plug 86a connects the first P2₊ lower conductive piece 94a and the first P2₊ upper conductive piece 84a, and is positioned corresponding to the first row and a first column of the P2₊ first-level array 92 and of the P2₊ second-level array 82, and connects the first P2₊ lower conductive pieces 94a and 94c with the first P2₊ upper conductive pieces 84a and 84b. The P2₊ contact plug 86d connects the second P2₊ lower conductive piece 94d and the second P2₊ upper conductive piece 84d and is positioned corresponding to the second row and a second column of the P2₊ first-level array 92 and of the P2₊ second-level array 82. The P2₊ contact plug 86d connects the second P2₊ lower conductive pieces 94b and 94d with the second P2₊ upper conductive pieces 84c and 84d.

Figure 6A:
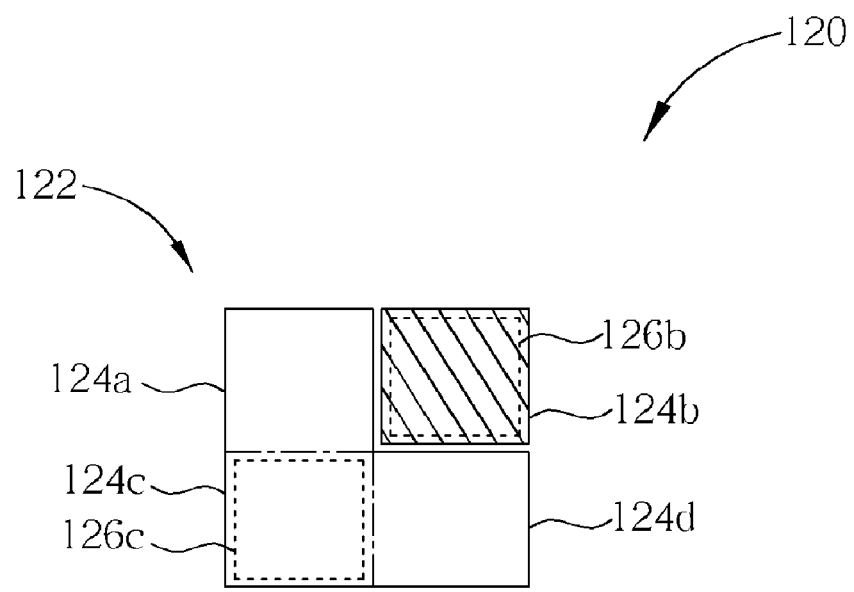
FIG. 6A and FIG. 6B schematically illustrate a capacitor structure according to a fifth embodiment of the present invention.
Figure 6B:
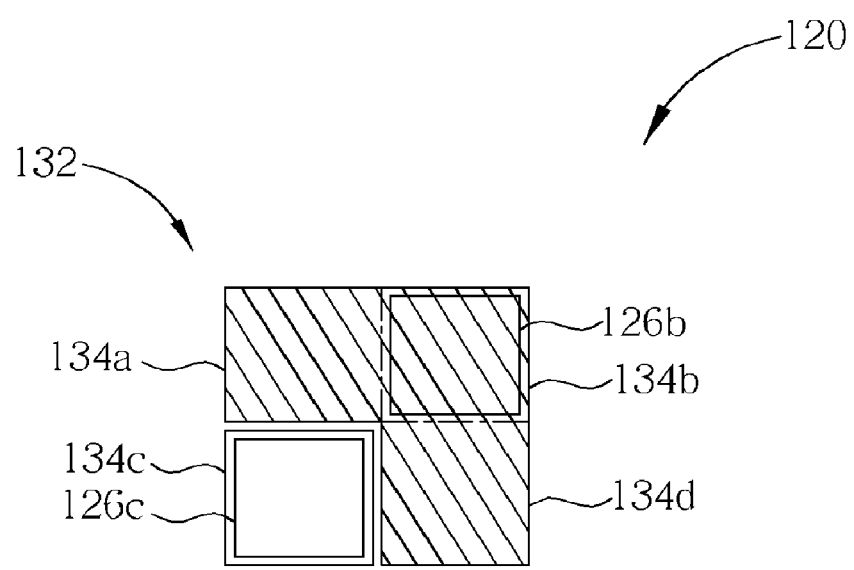

Please refer to FIG. 6A and FIG. 6B. FIG. 6A and FIG. 6B schematically illustrate a capacitor structure 120 according to a fifth embodiment of the present invention. As shown in FIG. 6A and FIG. 6B, the capacitor structure 120 includes a diagonal-first-minor (D1₋) block array, and the D1₋ block array includes a D1₋ first-level array 132, a D1₋ second-level array 122 positioned above the D1₋ first-level array 132, and a plurality of DL contact plugs 126b, 126c. The D1₋ first-level array 132 includes three first D1₋ lower conductive pieces 134a, 134b, 134d and a second D1₋ lower conductive piece 134c. The first D1₋ lower conductive pieces 134a, 134b are disposed in a first row of the D1₋ first-level array 132. The second D1₋ lower conductive piece 134c and the first D1₋ lower conductive piece 134d are disposed in a second row of the D1₋ first-level array 132 from left to right. It should be noted that the adjacent first D1₋ lower conductive pieces 134a, 134b and 134d are connected to each other, and the first D1₋ lower conductive pieces 134a, 134b and 134d are not connected to the second D1₋ lower conductive piece 134c. The D1₋ second-level array 122 includes a first D1₋ upper conductive piece 124b and three second D1₋ upper conductive pieces 124a, 124c, 124d. The second D1₋ upper conductive piece 124a and the first D1₋ upper conductive piece 124b are disposed in a first row of the D1₋ second-level array 122 from left to right, and the second DL upper conductive pieces 124c, 124d are disposed in a second row of the D1₋ second-level array 122. The adjacent second D1₋ upper conductive pieces 124a, 124c and 124d are connected to each other, and the first D1₋ upper conductive piece 124b is not connected to the second D1₋ upper conductive pieces 124a, 124c and 124d.

The D1₋ contact plug 126b connects the first D1₋ lower conductive piece 134b and the first D1₋ upper conductive piece 124b, and is positioned corresponding to the first row and a second column of the D1₋ first-level array 132 and of the D1₋ second-level array 122, and connects the first D1₋ lower conductive pieces 134a, 134b, 134d with the first D1₋ upper conductive piece 124b. The D1₋ contact plug 126c connects the second D1₋ lower conductive piece 134c and the second D1₋ upper conductive piece 124c and is positioned corresponding to the second row and a first column of the D1₋ first-level array 132 and of the D1₋ second-level array 122. The D1₋ contact plug 126c connects the second D1₋ lower conductive piece 134c with the second D1₋ upper conductive pieces 124a, 124c and 124d.

Figure 7A:
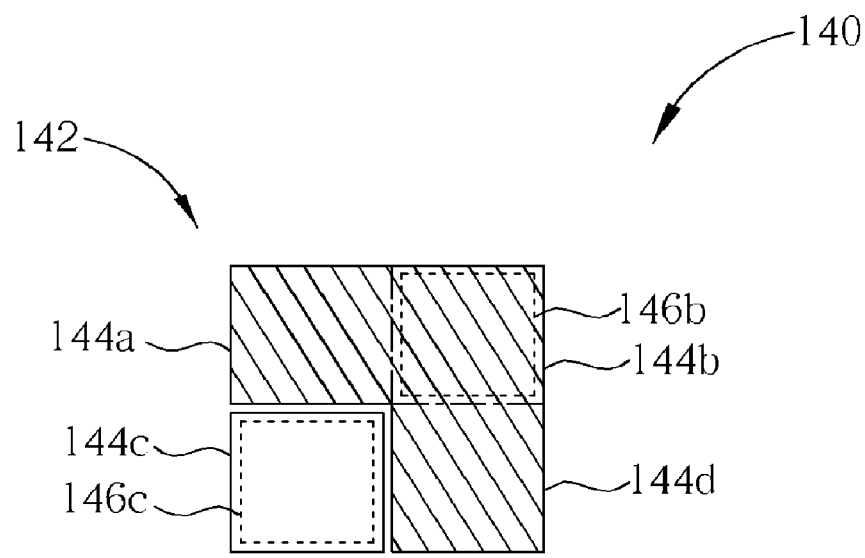
FIG. 7A and FIG. 7B schematically illustrate a capacitor structure according to a sixth embodiment of the present invention.
Figure 7B:
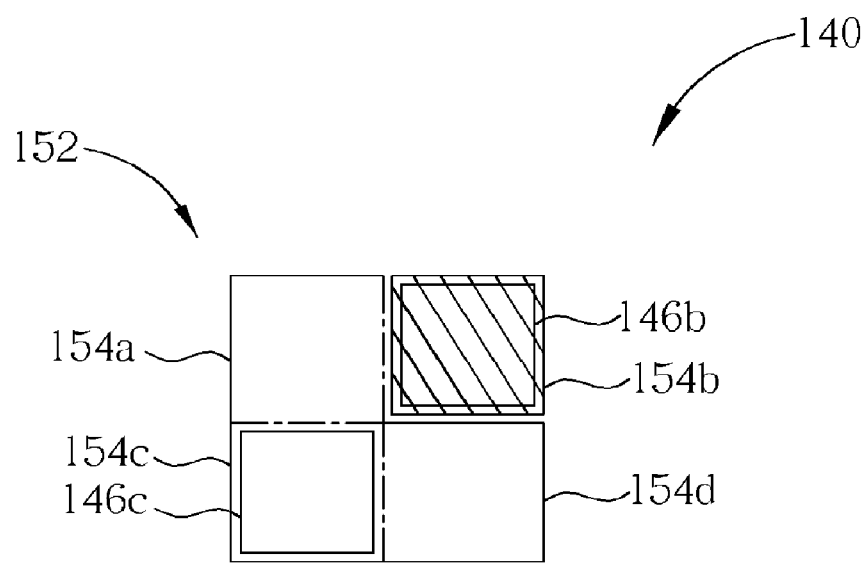

Please refer to FIG. 7A and FIG. 7B. FIG. 7A and FIG. 7B schematically illustrate a capacitor structure 140 according to a sixth embodiment of the present invention. As shown in FIG. 7A and FIG. 7B, the capacitor structure 140 includes a diagonal-second-minor (D2₋) block array, and the D2₋ block array includes a D2₋ first-level array 152, a D2₋ second-level array 142 positioned above the D2₋ first-level array 152, and a plurality of D2₋ contact plugs 146b, 146c. The D2₋ first-level array 152 includes three second D2₋ lower conductive pieces 154a, 154c, 154d and a first D2₋ lower conductive piece 154b. The second D2₋ lower conductive piece 154a and the first D2₋ lower conductive piece 154b are disposed in a first row of the D2₋ second-level array 152 from left to right. The second D2₋ lower conductive pieces 154c and 154d are disposed in a second row of the D2₋ second-level array 152. It is worth noting that the adjacent second D2₋ lower conductive pieces 154a, 154c and 154d are connected to each other, and the first D2₋ lower conductive piece 154b is not connected to the second D2₋ lower conductive pieces 154a, 154c and 154d.

The D2₋ second-level array 142 includes three first D2₋ upper conductive pieces 144a, 144b, 144d and a second D2₋ upper conductive piece 144c. The first D2₋ upper conductive pieces 144a and 144b are disposed in a first row of the D2₋ first-level array 142, and the second D2₋ upper conductive piece 144c and the first D2₋ upper conductive piece 144d are disposed in a second row of the D2₋ first-level array 142 from left to right. The adjacent first D2₋ upper conductive pieces 144a, 144b and 144d are connected to each other, and the second D2₋ upper 144c conductive piece is not connected to the first D2₋ upper conductive pieces 144a, 144b and 144d.

The D2₋ contact plug 146b connects the first D2₋ lower conductive piece 154b and the first D2₋ upper conductive piece 144b, and is positioned corresponding to the first row and a second column of the D2₋ first-level array 152 and of the D2₋ second-level array 142, and connects the first D2₋ lower conductive piece 154b with the first D2₋ upper conductive pieces 144a, 144b, 144d. The D2₋ contact plug 146c connects the second D2₋ lower conductive piece 154c and the second D2₋ upper conductive piece 144c and is positioned corresponding to the second row and a first column of the D2_ first-level array 152 and of the D2_ second-level array 142. The D2_ contact plug 146c connects the second D2_ lower conductive pieces 154a, 154c and 154d with the second D2_ upper conductive piece 144c.

Figure 8A:
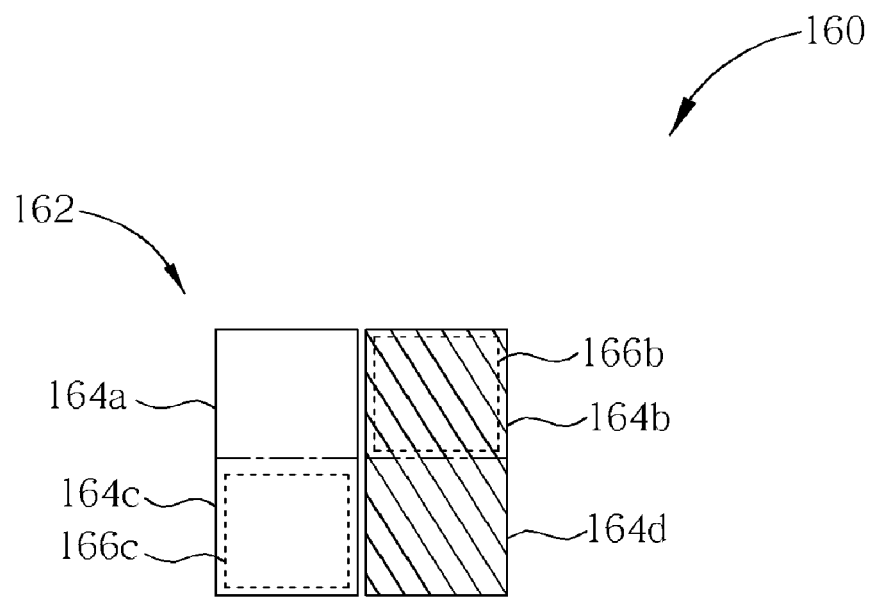
FIG. 8A and FIG. 8B schematically illustrate a capacitor structure according to a seventh embodiment of the present invention.
Figure 8B:
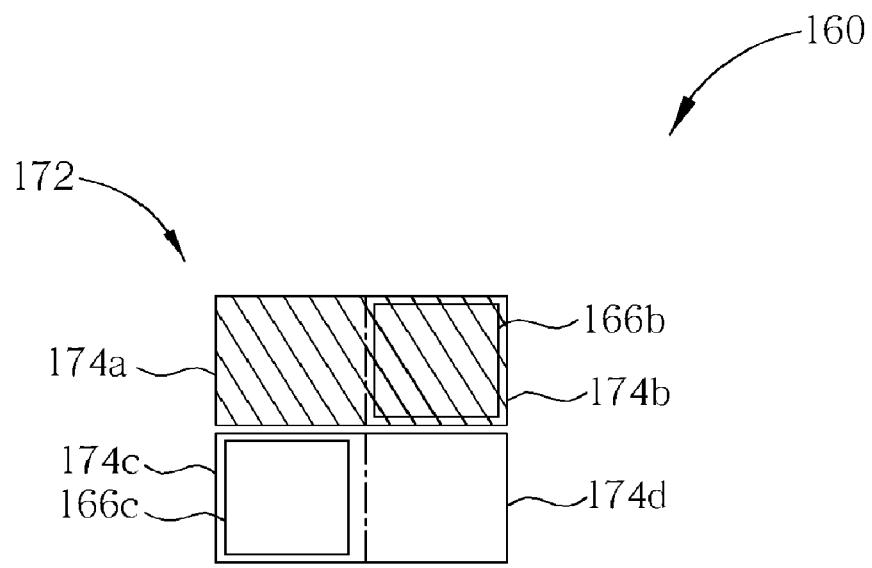

Please refer to FIG. 8A and FIG. 8B. FIG. 8A and FIG. 8B schematically illustrate a capacitor structure 160 according to a seventh embodiment of the present invention.

As shown in FIG. 8A and FIG. 8B, the capacitor structure 160 includes a parallel-first-minor (P1_) block array, and the P1_ block array includes a P1_ first-level array 172, a P1_ second-level array 162 positioned above the P1_ first-level array 172, and a plurality of P1_ contact plugs 166b, 166c. The P1_ first-level array 172 includes two first P1_ lower conductive pieces 174a, 174b and two second P1_ lower conductive pieces 174c and 174d. Accordingly, the first P1_ lower conductive pieces 174a and 174b are disposed in a first row of the P1_ first-level array 172, and the second P1_ lower conductive pieces 174c and 174d are disposed in a second row of the P1_ first-level array 172. The adjacent first P1_ lower conductive pieces 174a and 174b are connected to each other, and the adjacent second P1_ lower conductive pieces 174c and 174d are connected to each other. The first P1_ lower conductive pieces 174a and 174b are not connected to the second P1_ lower conductive pieces 174c and 174d.

The P1_ second-level array 162 includes two first P1_ upper conductive pieces 164b, 164d and two second P1_ upper conductive pieces 164a and 164c. The second P1_ upper conductive piece 164a and the first P1_ upper conductive piece 164b are disposed in a first row of the P1_ first-level array 162 from left to right. The second P1_ upper conductive piece 164c and the first P1_ upper conductive piece 164d are disposed in a second row of the P1_ first-level array 162 from left to right. The adjacent first P1_ upper conductive pieces 164b and 164d are connected to each other, and the adjacent second P1_ upper conductive pieces 164a and 164c are connected to each other. The first P1_ upper conductive pieces 164b and 164d are not connected to the second P1_ upper conductive pieces 164a and 164c.

The P1_ contact plug 166b connects the first P1_ lower conductive piece 174b and the first P1_ upper conductive piece 164b, and is positioned corresponding to the first row and a second column of the P1_ first-level array 172 and of the P1_ second-level array 162, and connects the first P1_ lower conductive pieces 174a, 174b with the first P1_ upper conductive pieces 164b and 164d. The P1_ contact plug 166c connects the second P1_ lower conductive piece 174c and the second P1_ upper conductive piece 164c and is positioned corresponding to the second row and a first column of the P1_ first-level array 172 and of the P1_ second-level array 162. The P1_ contact plug 166c connects the second P1_ lower conductive pieces 174c, 174d with the second P1_ upper conductive pieces 164a, 164c.

Figure 9A:
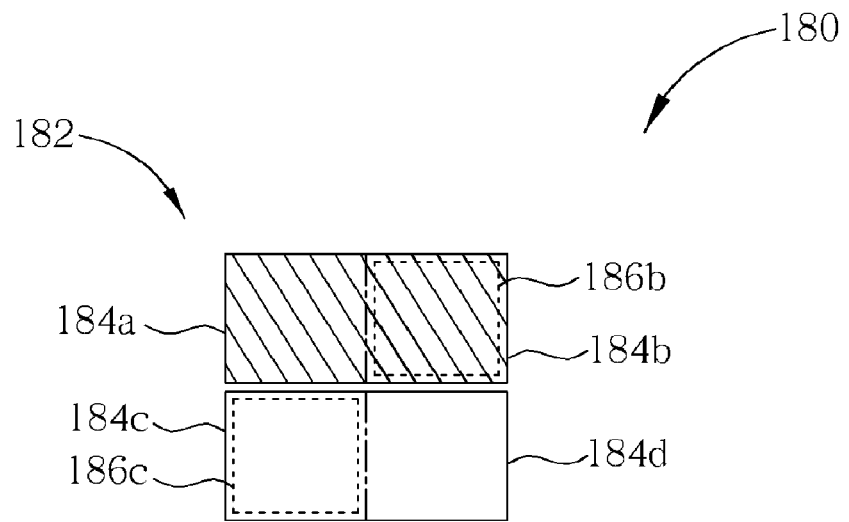
FIG. 9A and FIG. 9B schematically illustrate a capacitor structure according to an eighth embodiment of the present invention.
Figure 9B:
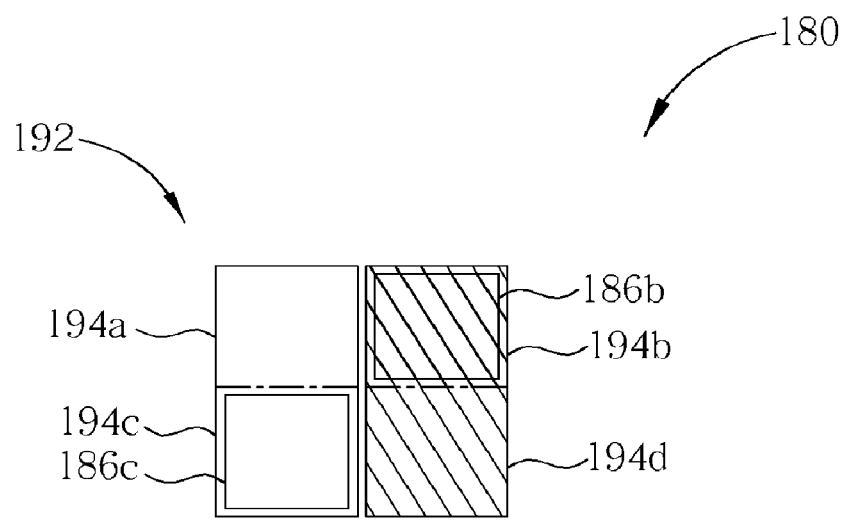

Please refer to FIG. 9A and FIG. 9B. FIG. 9A and FIG. 9B schematically illustrate a capacitor structure 180 according to an eighth embodiment of the present invention. As shown in FIG. 9A and FIG. 9B, the capacitor structure 180 includes a parallel-second-minor (P2_) block array, and the P2_ block array includes a P2_ first-level array 192, a P2_ second-level array 182 positioned above the P2_ first-level array 192, and a plurality of P2_ contact plugs 186b, 186c. The P2_ first-level array 192 includes two first P2_ lower conductive pieces 194b, 194d and two second P2_ lower conductive pieces 194a and 194c. Accordingly, the second P2_ lower conductive piece 194a and the first P2_ lower conductive piece 194b are disposed in a first row of the P2_ first-level array 192 from left to right. The second P2_ lower conductive piece 194c and the first P2_ lower conductive piece 194d are disposed in a second row of the P2_ first-level array 192 from left to right. The adjacent first P2_ lower conductive pieces 194b and 194d are connected to each other, and the adjacent second P2_ lower conductive pieces 194a and 194c are connected to each other. The first P2_ lower conductive pieces 194b and 194d are not connected to the second P2_ lower conductive pieces 194a and 194c.

The P2_ second-level array 182 includes two first P2_ upper conductive pieces 184a, 184b and two second P2_ upper conductive pieces 184c and 184d. The first P2_ upper conductive pieces 184a and 184b are disposed in a first row of the P2_ second-level array 182, where the adjacent first P2_ upper conductive pieces 184a and 184b connect to each other. The second P2_ upper conductive pieces 184c and 184d are disposed in a second row of the P2_ second-level array 182, where the adjacent second P2_ upper conductive pieces 184c and 184d connect to each other. The first P2_ upper conductive pieces 184a and 184b are not connected to the second P2_ upper conductive pieces 184c and 184d.

The P2_ contact plug 186b connects the first P2_ lower conductive piece 194b and the first P2_ upper conductive piece 184b, and is positioned corresponding to the first row and a second column of the P2_ first-level array 192 and of the P2_ second-level array 182, and connects the first P2_ lower conductive pieces 194b and 194d with the first P2_ upper conductive pieces 184a and 184b. The P2_ contact plug 186c connects the second P2_ lower conductive piece 194c and the second P2_ upper conductive piece 184c and is positioned corresponding to the second row and a first column of the P2_ first-level array 192 and of the P2_ second-level array 182. The P2_ contact plug 186c connects the second P2_ lower conductive pieces 194a and 194c with the second P2_ upper conductive pieces 184c and 184d.

According to the embodiments of the present invention, the capacitor structure can include any conducting array, which is a combination of the above-mentioned $D1_+$ block array, $D2_+$ block array, $P1_+$ block array, $P2_+$ block array, $D1_-$ block array, $D2_-$ block array, $P1_-$ block array and/or $P2_-$ block array. In addition, it is preferable that the major block array, such as the $D1_+$ block array, $D2_+$ block array, $P1_+$ block array and $P2_+$ block array, is adjacent to the minor block array, such as the $D1_-$ block array, $D2_-$ block array, $P1_-$ block array and $P2_-$ block array. Please refer to FIG. 10A, FIG. 10B, FIG. 11A, FIG. 11B, FIG. 12A, FIG. 12B, FIG. 13A, FIG. 13B, FIG. 14A, FIG. 14B, FIG. 15A, and FIG. 15B. FIG. 10A, FIG. 10B, FIG. 11A, FIG. 11B, FIG. 12A, FIG. 12B, FIG. 13A, FIG. 13B, FIG. 14A, FIG. 14B, FIG. 15A, and FIG. 15B schematically illustrate two capacitor structures according to two respective embodiments of the present invention, respectively. FIG. 10A, FIG. 10B, FIG. 11A, FIG. 11B, FIG. 12A, FIG. 12B, FIG. 13A, FIG. 13B, FIG. 14A, FIG. 14B, FIG. 15A, and FIG. 15B show the capacitor structures, which are combinations of a major block array and a minor block array.

Figure 10A:
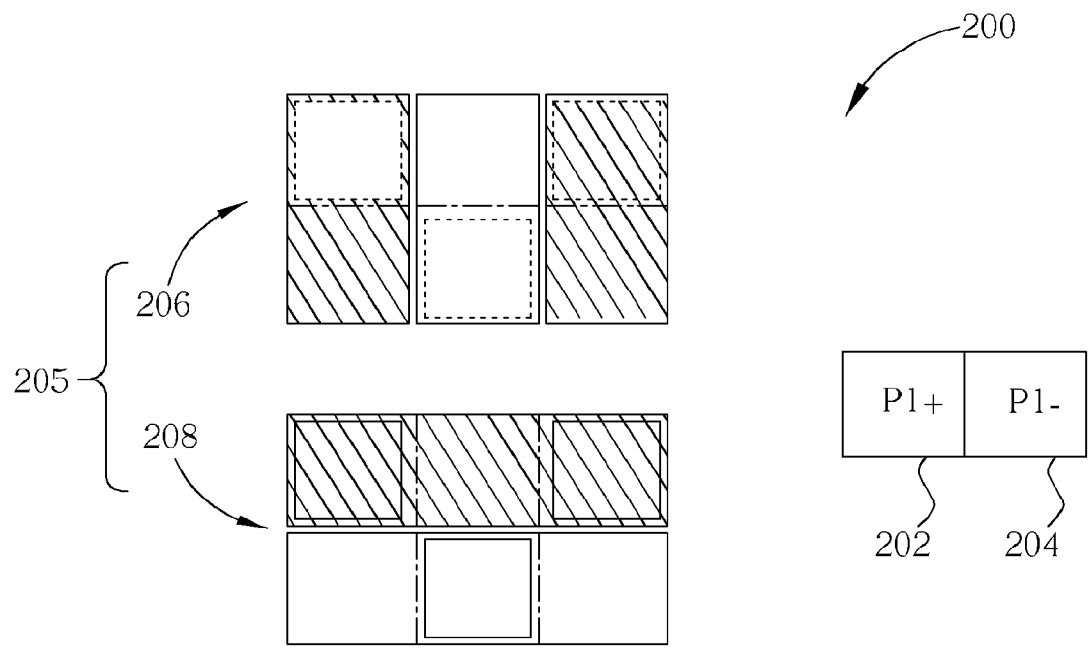
FIG. 10A and FIG. 10B schematically illustrate capacitor structures according to a ninth embodiment and a tenth embodiment respectively of the present invention.
Figure 10B:
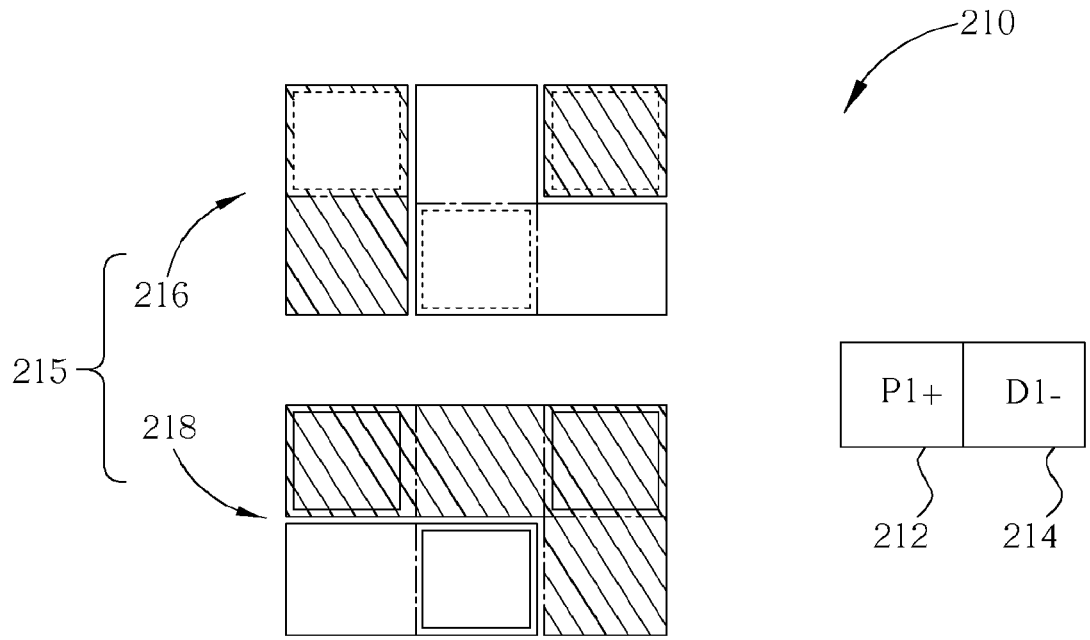

FIG. 10A and FIG. 10B schematically illustrate a capacitor structure 200 and a capacitor structure 210 according to a ninth embodiment and a tenth embodiment respectively of the present invention. As shown in FIG. 10A and FIG. 10B, the capacitor structure 200 includes a conducting array 205. The conducting array 205 includes a first-level 208, a second-level 206 positioned above the first-level 208, and a plurality of contact plugs for connecting the first-level 208 with the second-level 206. The first-level 208 of the conducting array 205 contains a $P1_+$ first-level array of a $P1_+$ block array 202, and a P1_ first-level array of a P1_ block array 204. The second-level 206 of the conducting array 205 contains a $P1_+$ second-level array of a $P1_+$ block array 202, and a P1_ second-level array of a P1_ block array 204. In other words, the conducting array 205 includes a P1₊ block array 202, and a P1_ block array 204 adjacent to the P1₊ block array 202 horizontally as shown in the figure.

On the other hand, the capacitor structure 210 includes a conducting array 215. The conducting array 215 includes a first-level 218, a second-level 216 positioned above the first-level 218, and a plurality of contact plugs for connecting the first-level 218 with the second-level 216. The first-level 218 of the conducting array 215 contains a P1₊ first-level array of a P1₊ block array 212, and a D1_ first-level array of a D1_ block array 214. The second-level 216 of the conducting array 215 contains a P1₊ second-level array of a P1₊ block array 212, and a D1_ second-level array of a D1_ block array 214. In other words, the conducting array 215 includes a P1₊ block array 212, and a D1_ block array 214 adjacent to the P1₊ block array 212 horizontally as shown in the figure.

It should be noted that the adjacent conductive pieces of adjacent block arrays connect to each other in each level, no matter whether the connected conductive pieces in the adjacent columns are the first conductive pieces or the second conductive pieces. In other words, adjacent block arrays, which are adjacent to each other horizontally, share a column. For example, in the capacitor structure 200, the second column of the P1₊ block array 202 is also the first column of the P1_ block array 204. In the capacitor structure 210, the second column of the P1₊ block array 212 is also the first column of the D1_ block array 214. The adjacent conductive pieces that are connected together are coupled to the same voltage. The first conductive pieces in different levels of one capacitor structure are connected to each other through contact plugs, and the second conductive pieces in different levels of one capacitor structure are connected to each other through contact plugs.

Figure 11A:
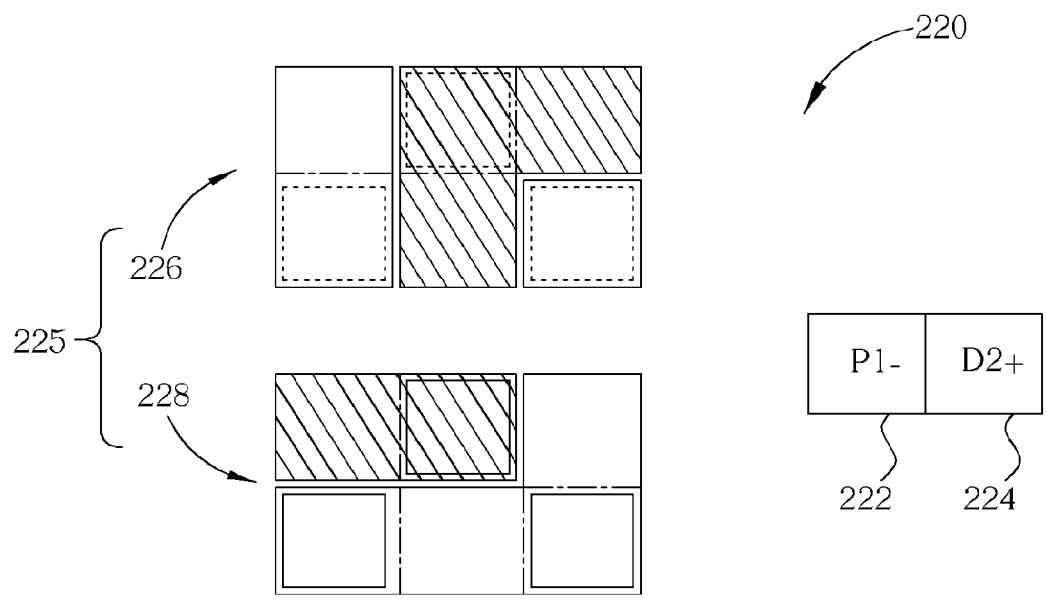
FIG. 11A and FIG. 11B schematically illustrate capacitor structures according to an eleventh embodiment and a twelfth embodiment respectively of the present invention.
Figure 11B:
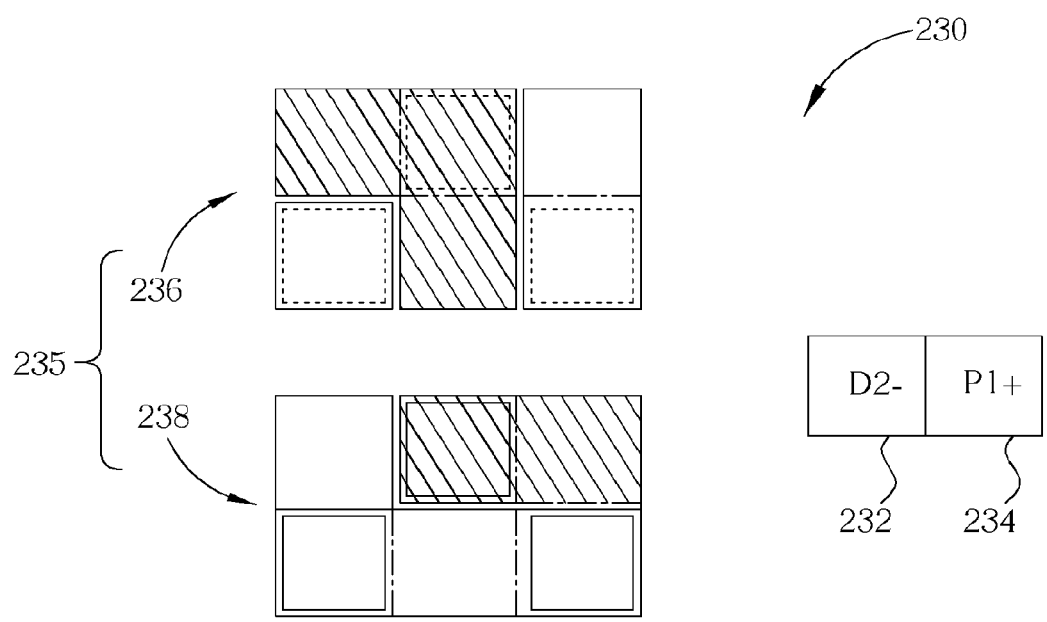

FIG. 11A and FIG. 11B schematically illustrate a capacitor structure 220 and a capacitor structure 230 according to an eleventh embodiment and a twelfth embodiment respectively of the present invention. As shown in FIG. 11A and FIG. 11B, the capacitor structure 220 includes a conducting array 225. The conducting array 225 includes a first-level 228, a second-level 226 positioned above the first-level 228, and a plurality of contact plugs for connecting the first-level 228 with the second-level 226. The conducting array 225 includes a P1_ block array 222, and a D2₊ block array 224 adjacent to the P1_ block array 222 horizontally. In the capacitor structure 220, the second column of the P1_ block array 222 is also the first column of the D2₊ block array 214. On the other hand, the capacitor structure 230 includes a conducting array 235. The conducting array 235 includes a first-level 238, a second-level 236 positioned above the first-level 238, and a plurality of contact plugs. The conducting array 235 includes a D2_ block array 232, and a P1₊ block array 234 adjacent to the D2_ block array 232 horizontally. The second column of the D2_ block array 232 is also the first column of the P1₊ block array 234.

Figure 12A:
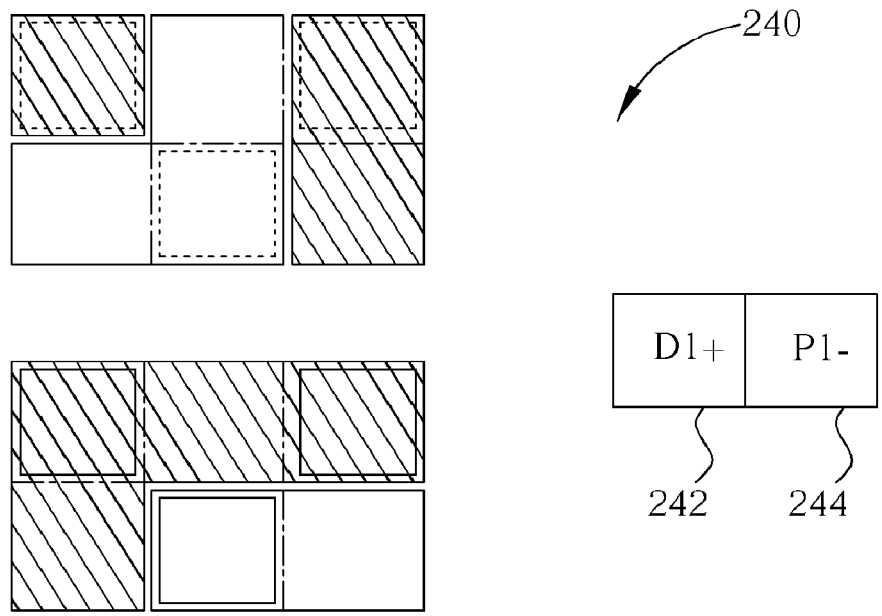
FIG. 12A and FIG. 12B schematically illustrate capacitor structures according to a thirteenth embodiment and a fourteenth embodiment respectively of the present invention.
Figure 12B:
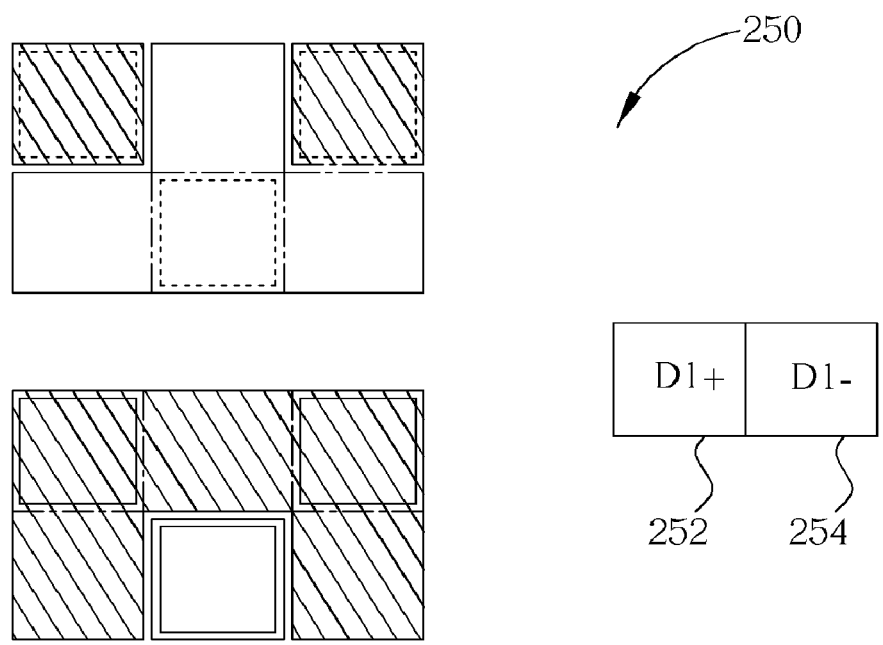

FIG. 12A and FIG. 12B schematically illustrate a capacitor structure 240 and a capacitor structure 250 according to a thirteenth embodiment and a fourteenth embodiment respectively of the present invention. As shown in FIG. 12A and FIG. 12B, the capacitor structure 240 includes a D1₊ block array 242, and a P1_ block array 244 adjacent to the D1₊ block array 242 horizontally. The second column of the D1₊ block array 242 is also the first column of the P1_ block array 244. On the other hand, the capacitor structure 250 includes a D1₊ block array 252, and a DL block array 254 horizontally adjacent to the D1₊ block array 252. The second column of the D1₊ block array 252 is also the first column of the DL block array 254.

Figure 13A:
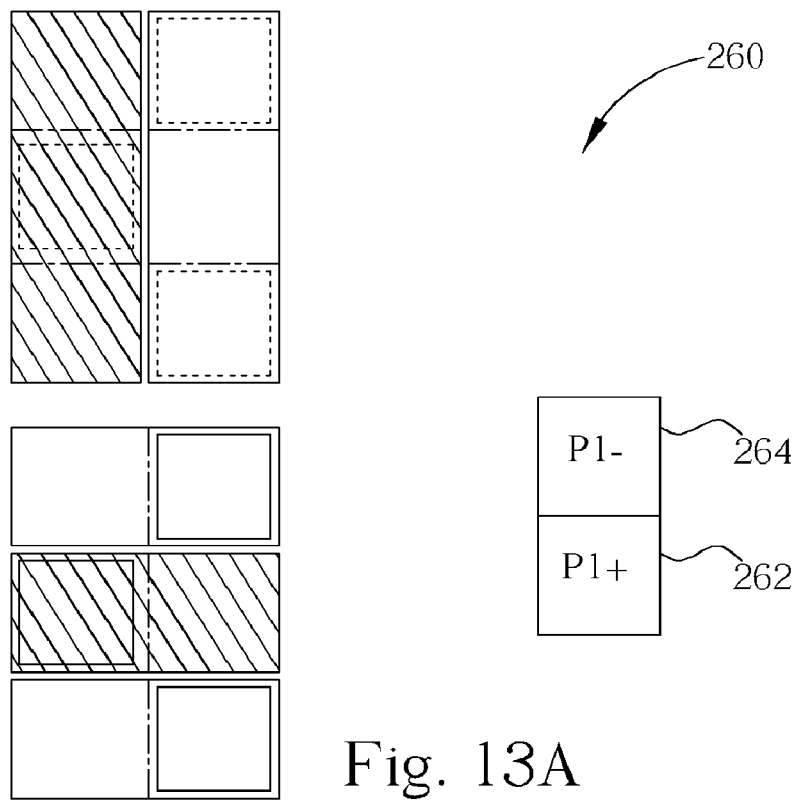
FIG. 13A and FIG. 13B schematically illustrate capacitor structures according to a fifteenth embodiment and a sixteenth embodiment respectively of the present invention.
Figure 13B:
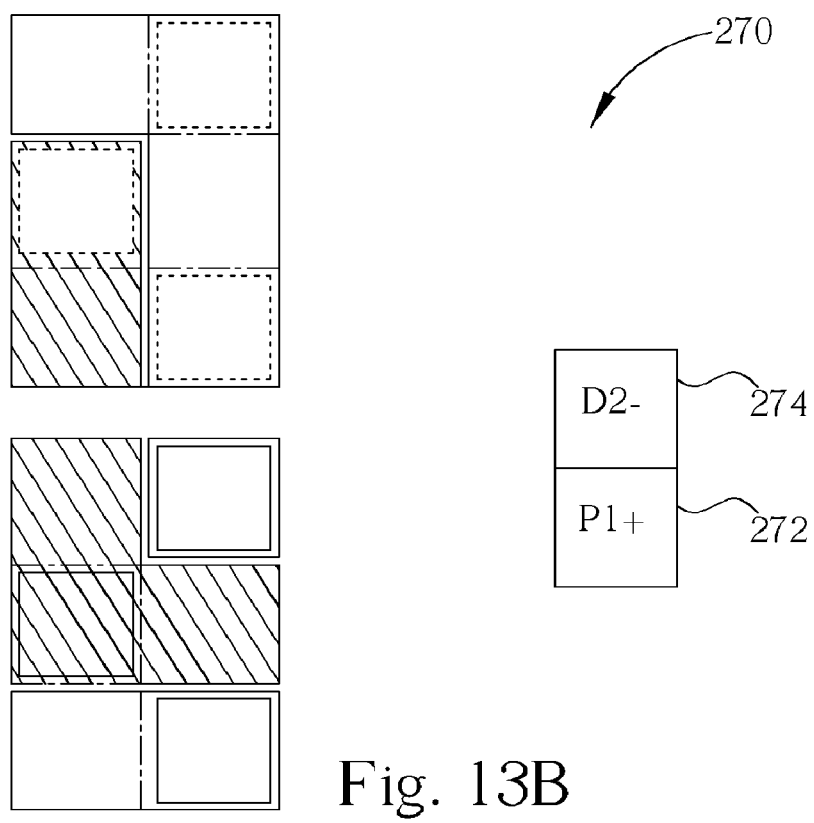

FIG. 13A and FIG. 13B schematically illustrate a capacitor structure 260 and a capacitor structure 270 according to a fifteenth embodiment and a sixteenth embodiment respectively of the present invention. As shown in FIG. 13A and FIG. 13B, the capacitor structure 260 includes a P1₊ block array 262, and a P1_ block array 264 vertically adjacent to the P1₊ block array 262. The first row of the P1₊ block array 262 is also the second row of the P1_ block array 264. According to this arrangement, the conductive pieces in the first column of the P1₊ block array 262 and the conductive pieces in the first column of the P1_ block array 264 are coupled to a first voltage in the second-level. The conductive pieces in the second column of the P1₊ block array 262 and the conductive pieces in the second column of the P1_ block array 264 are coupled to a second voltage in the second-level. In the first-level, the conductive pieces in the first row of the P1₊ block array 262 and the conductive pieces in the second row of the P1_ block array 264 are coupled to the first voltage, and the conductive pieces in the second row of the P1₊ block array 262 and the conductive pieces in the first row of the P1_ block array 264 are coupled to second voltage.

On the other hand, the capacitor structure 270 includes a P1₊ block array 272, and a D2_ block array 274 vertically adjacent to the P1₊ block array 272. The first row of the P1₊ block array 272 is also the second row of the D2_ block array 274. The conductive piece in the first row and in the first column of the D2_ block array 274 in the first-level, the conductive pieces in the second row of the D2_ block array 274 in the first-level, and the conductive pieces in the first column of the P1₊ block array 272 in the second-level are coupled to a first voltage. The other conductive pieces are coupled to a second voltage.

Figure 14A:
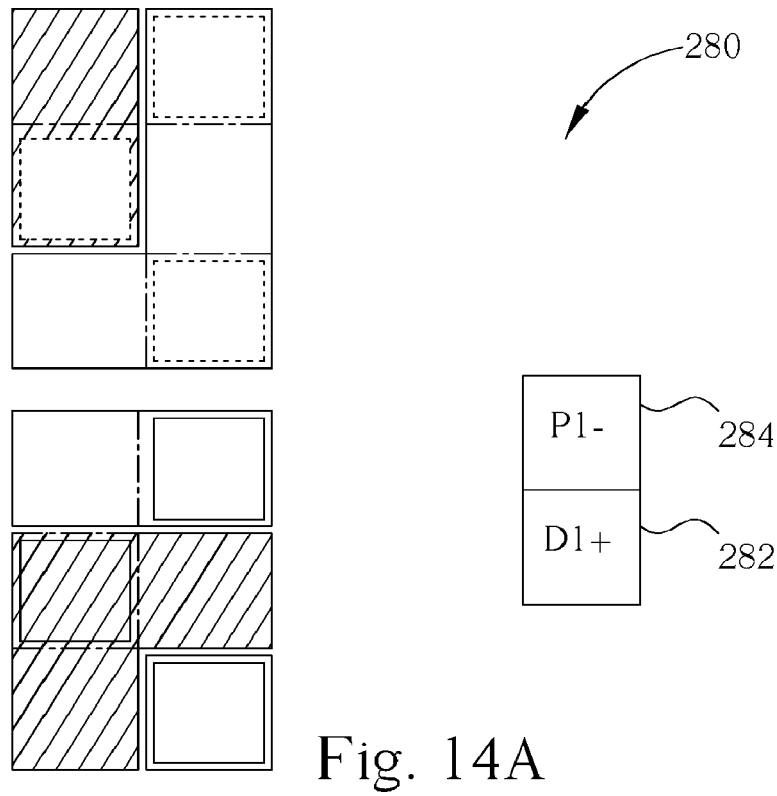
FIG. 14A and FIG. 14B schematically illustrate capacitor structures according to a seventeenth embodiment and an eighteenth embodiment respectively of the present invention.
Figure 14B:
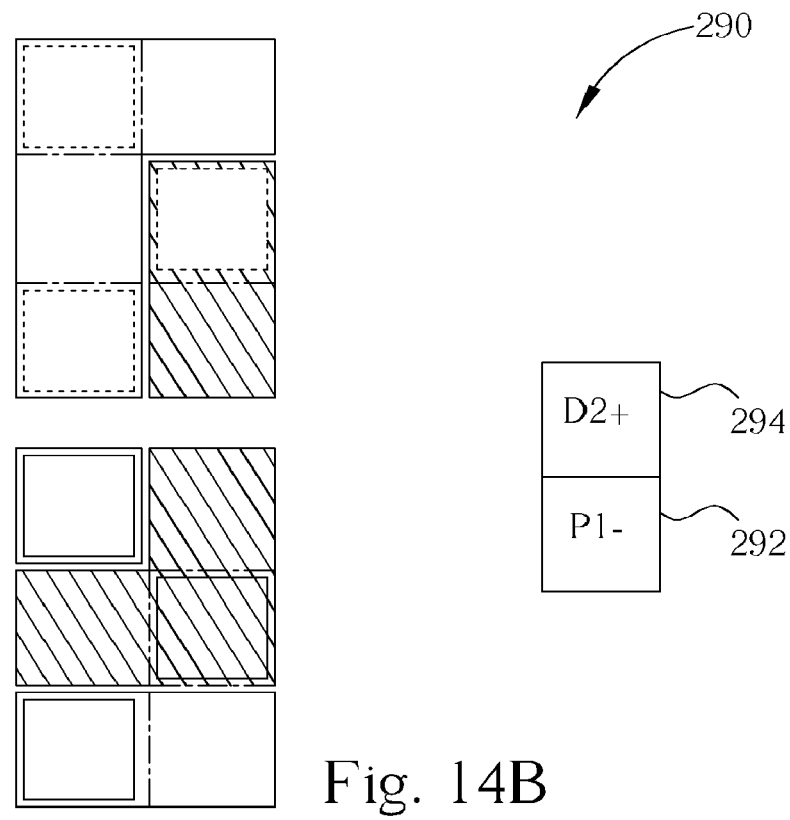

FIG. 14A and FIG. 14B schematically illustrate a capacitor structure 280 and a capacitor structure 290 according to a seventeenth embodiment and a eighteenth embodiment respectively of the present invention. As shown in FIG. 14A and FIG. 14B, the capacitor structure 280 includes a D1₊ block array 282, and a P1_ block array 284 vertically adjacent to the D1₊ block array 282. The first row of the D1₊ block array 282 is also the second row of the P1_ block array 284. On the other hand, the capacitor structure 290 includes a P1_ block array 292, and a D2₊ block array 294 vertically adjacent to the P1_ block array 292. The first row of the P1_ block array 292 is also the second row of the D2₊ block array 294.

Figure 15A:
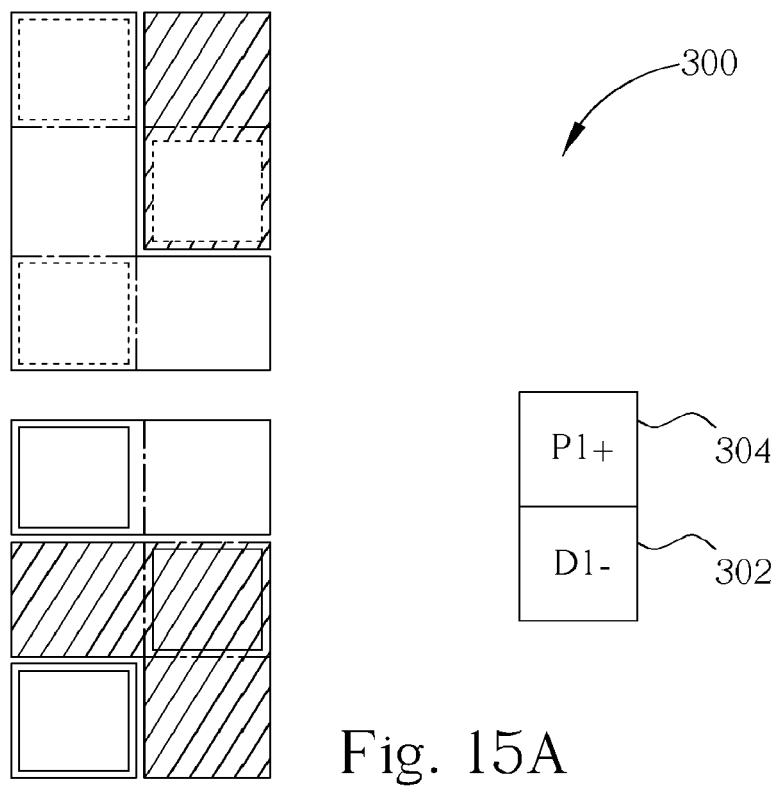
FIG. 15A and FIG. 15B schematically illustrate capacitor structures according to a nineteenth embodiment and a twentieth embodiment respectively of the present invention.
Figure 15B:
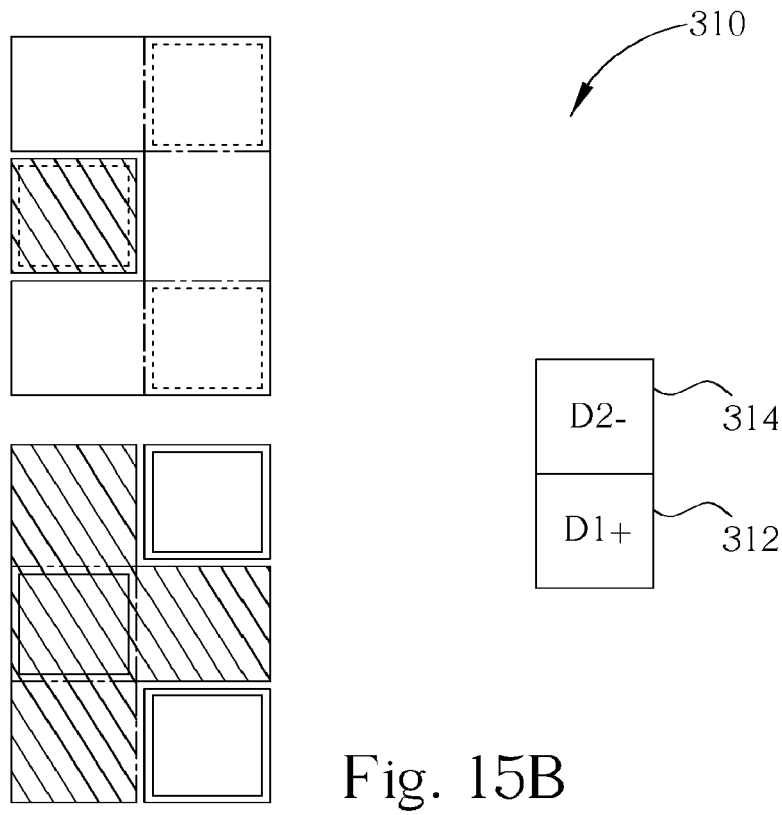

FIG. 15A and FIG. 15B schematically illustrate a capacitor structure 300 and a capacitor structure 310 according to a nineteenth embodiment and a twentieth embodiment respectively of the present invention. As shown in FIG. 15A and FIG. 15B, the capacitor structure 300 includes a D1_ block array 302, and a P1₊ block array 304 vertically adjacent to the D1_ block array 302. The first row of the DL block array 302 is also the second row of the P1₊ block array 304. On the other hand, the capacitor structure 310 includes a D1₊ block array 312, and a D2_ block array 314 vertically adjacent to the D1₊ block array 312. The first row of the D1₊ block array 312 is also the second row of the D2_ block array 314.

Please refer to FIG. 16A, FIG. 16B, FIG. 16C, FIG. 17A, FIG. 17B, FIG. 17C, FIG. 18A, FIG. 18B, FIG. 18C, FIG. 19A, FIG. 19B, FIG. 19C, FIG. 20A, FIG. 20B, AND FIG. 20C. FIG. 16A, FIG. 16B and FIG. 16C schematically illustrate capacitor structures 320 according to a twentieth-first embodiment respectively of the present invention. FIG. 17A, FIG. 17B and FIG. 17C schematically illustrate capacitor structures 330 according to a twentieth-second embodiment respectively of the present invention. FIG. 18A, FIG. 18B and FIG. 18C schematically illustrate capacitor structures 340 according to a twentieth-third embodiment respectively of the present invention. FIG. 19A, FIG. 19B and FIG. 19C schematically illustrate capacitor structures 350 according to a twentieth-fourth embodiment respectively of the present invention. FIG. 20A, FIG. 20B and FIG. 20C schematically illustrate capacitor structures 360 according to a twentieth-fifth embodiment respectively of the present invention.

As shown in FIG. 16A, FIG. 16B and FIG. 16C, the capacitor structure 320 includes a conducting array 322, and the conducting array 322 is an L-type layout. The conducting array 322 has four $D1_+$ block arrays, four $P1_-$ block arrays, four $P2_-$ block arrays, two $P1_+$ block arrays and two $P2_+$ block arrays. In a first row of the conducting array 322, one of the $D1_+$ block arrays, one of the $P1_-$ block arrays, one of the $P1_+$ block arrays and one of the $P1_-$ block arrays are disposed from left to right. In a second row of the conducting array 322, one of the $P2_-$ block arrays, one of the $D1_+$ block arrays, one of the $P1_-$ block arrays and one of the $P1_+$ block arrays are disposed from left to right. In a third row of the conducting array 322, one of the $P2_+$ block arrays, one of the $P2_-$ block arrays, one of the $D1_+$ block arrays and one of the $P1_-$ block arrays are disposed from left to right. In a fourth row of the conducting array 322, one of the $P2_-$ block arrays, one of the $P2_+$ block arrays, one of the $P2_-$ block arrays and one of the $D1_+$ block arrays are disposed from left to right.

The capacitor structure 320 in this embodiment is a two-layer structure. One layer is a first-level 328, and another layer is a second-level 326 positioned above the first-level 328. However, it should be understood by a person skilled in this art that the capacitor structures in the present invention could be a single-layer structure or a multi-layer structure. For instance, the first-level 328 or the second-level 326 can form a single-layer capacitor structure. For a single-layer capacitor structure, the $P1_-$ first-level array and the $P1_+$ first-level array have the same structure, and the $P2_-$ first-level array and the $P2_+$ first-level array have the same structure.

As shown in FIG. 17A, FIG. 17B and FIG. 17C, the capacitor structure 330 includes a conducting array 332, and the conducting array 332 is a ladder type layout. The conducting array 332 has four $D1_+$ block arrays, four $D2_+$ block arrays, four $P1_-$ block arrays and four $P2_-$ block arrays. In a first row of the conducting array 332, one of the $D1_+$ block arrays, one of the $P1_-$ block arrays, one of the $D2_+$ block arrays and one of the $P2_-$ block arrays are disposed from left to right. In a second row of the conducting array 332, one of the $P2_-$ block arrays, one of the $D1_+$ block arrays, one of the $P1_-$ block arrays and, one of the $D2_+$ block arrays are disposed from left to right. In a third row of the conducting array 332, one of the $D2_+$ block arrays, one of the $P2_-$ block arrays, one of the $D1_+$ block arrays and one of the $P1_-$ block arrays are disposed from left to right. In a fourth row of the conducting array 332, one of the $P1_-$ block arrays, one of the $D2_+$ block arrays, one of the $P2_-$ block arrays and, one of the $D1_+$ block arrays are disposed from left to right.

As shown in FIG. 18A, FIG. 18B and FIG. 18C, the capacitor structure 340 includes a conducting array 342, and the conducting array 342 is a zipper type layout. The conducting array 342 has two $D1_+$ block arrays, two $D2_+$ block arrays, two $D1_-$ block arrays, two $D2_-$ block arrays, two $P1_+$ block arrays, two $P2_+$ block arrays, two $P1_-$ block arrays and two $P2_-$ block arrays. In a first row of the conducting array 342, one of the $D2_+$ block arrays, one of the $P2_-$ block arrays, one of the $D1_+$ block arrays and one of the $P1_-$ block arrays are disposed from left to right. In a second row of the conducting array 342, one of the $D1_-$ block arrays, one of the $D2_-$ block arrays and, one of the $P1_+$ block arrays are disposed from left to right. In a third row of the conducting array 342, one of the $D2_+$ block arrays, one of the $P2_-$ block arrays, one of the $D1_-$ block arrays, one of the $P2_+$ block arrays, one of the $D2_-$ block arrays and, one of the $P1_+$ block arrays are disposed from left to right. In a fourth row of the conducting array 342, one of the $D1_-$ block arrays, one of the $P2_+$ block arrays, one of the $D2_-$ block arrays and, one of the $P1_+$ block arrays are disposed from left to right.

As shown in FIG. 19A, FIG. 19B and FIG. 19C, the capacitor structure 350 includes a conducting array 352, and the conducting array 352 is a hook type layout. The conducting array 352 has one $D1_+$ block array, one $D2_+$ block array, two $D1_-$ block arrays, two $D2_-$ block arrays, five $P1_+$ block arrays, four $P1_-$ block arrays and one $P2_-$ block array. In a first row of the conducting array 352, the $D2_+$ block array, one of the $D2_-$ block arrays, one of the $P1_+$ block arrays and one of the $P1_-$ block arrays are disposed from left to right. In a second row of the conducting array 352, one of the $P1_-$ block arrays, one of the $P1_+$ block arrays, one of the $P1_-$ block arrays and one of the $P1_+$ block arrays are disposed from left to right. In a third row of the conducting array 352, one of the $P1_+$ block arrays, one of the $D1_-$ block arrays, the $D1_+$ block array and one of the $P1_-$ block arrays are disposed from left to right. In a fourth row of the conducting array 352, one of the $D1_-$ block arrays, the $P2_+$ block array, one of the $D2_-$ block arrays and one of the $P1_+$ block arrays are disposed from left to right.

As shown in FIG. 20A, FIG. 20B and FIG. 20C, the capacitor structure 360 includes a conducting array 362, and the conducting array 362 is a branch-meander type layout. The conducting array 362 has two $D1_+$ block arrays, two $D2_+$ block arrays, two $D1_-$ block arrays, two $D2_-$ block arrays, two $P1_+$ block arrays, two $P2_+$ block arrays, two $P1_-$ block arrays and two $P2_-$ block arrays. In a first row of the conducting array 362, one of the $D1_+$ block arrays, one of the $P1_-$ block arrays, one of the $D2_+$ block arrays and one of the $P2_-$ block arrays are disposed from left to right. In a second row of the conducting array 362, one of the $P2_-$ block arrays, one of the $D1_+$ block arrays, one of the $P1_-$ block arrays and, one of the $D2_+$ block arrays are disposed from left to right. In a third row of the conducting array 362, one of the $P2_+$ block arrays, one of the $D2_-$ block arrays, one of the $P1_+$ block arrays and one of the $D1_-$ block arrays are disposed from left to right. In a fourth row of the conducting array 362, one of the $D2_-$ block arrays, one of the $P1_-$ block arrays, one of the $D1_-$ block arrays and, one of the $P2_-$ block arrays are disposed from left to right.

Figure 21A:
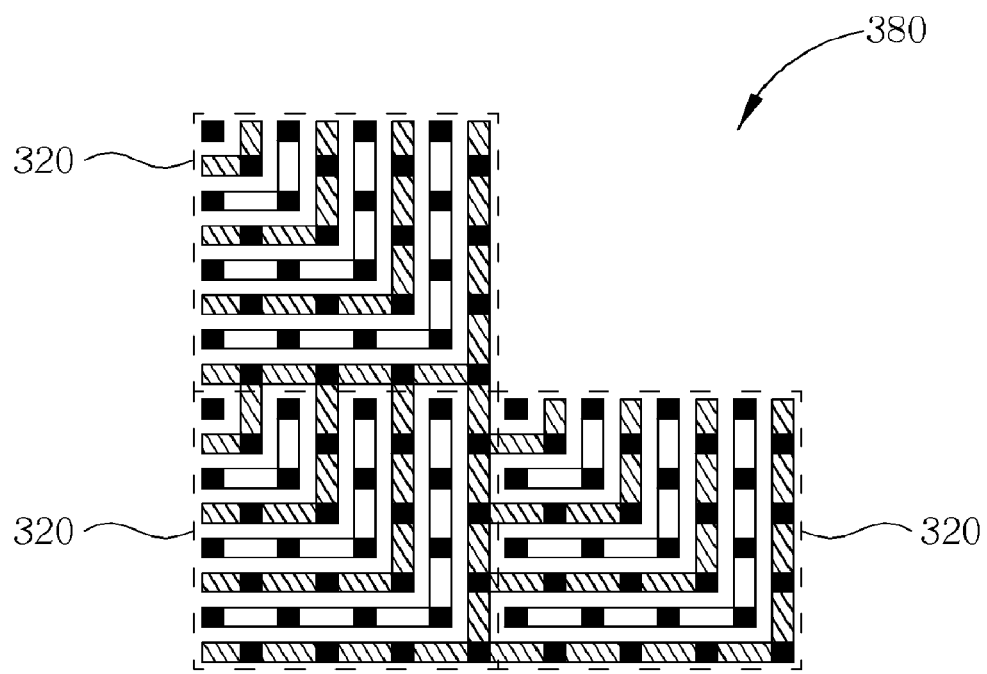
FIG. 21A and FIG. 21B show a capacitor structure according to a twenty-sixth embodiment of the present invention.
Figure 21B:
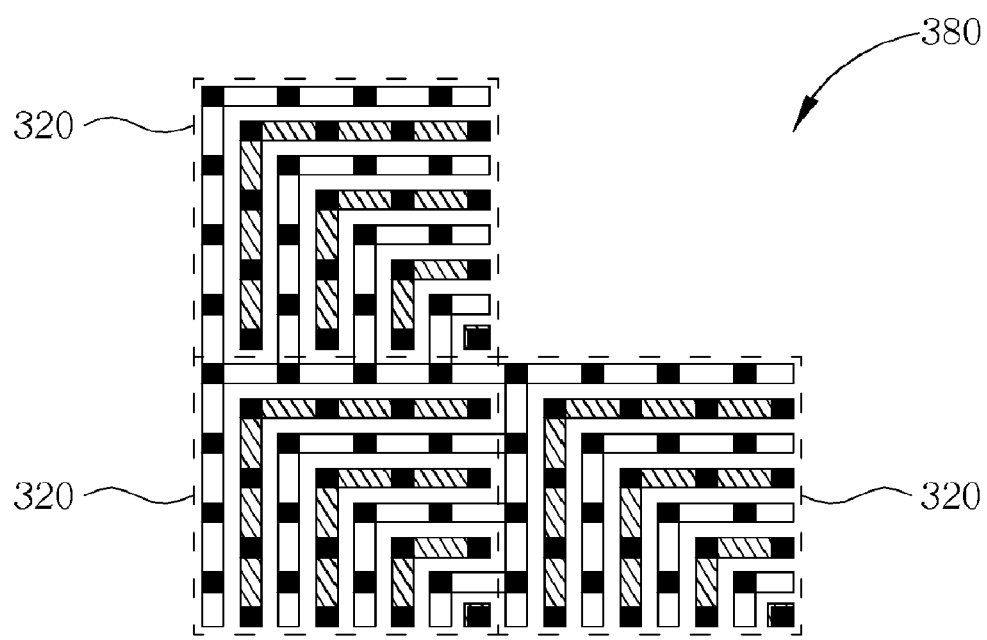

The above-mentioned capacitor structures can be further combined to form a fine capacitor. Please refer to FIG. 21A and FIG. 21B. FIG. 21A and FIG. 21B show the capacitor structure 380 according to a twenty-sixth embodiment of the present invention. As shown in FIG. 21A and FIG. 21B, the capacitor structure 380 is a combination of the capacitor structures 320 having L-type layout. It is noted that the combination of the capacitors 320 shown in FIG. 21A and FIG. 21B is illustrative, the capacitor structures 320 could be rotated and combined to form other arrangements according to different requirements.

In each capacitor structure, the conductive pieces and plugs that are coupled to the first voltage are a first electrode of a capacitor, and the conductive pieces and plugs that are coupled to the second voltage are a second electrode of a capacitor.

Since the capacitor structures in the present invention are composed of block arrays, and the conductive pieces in a block array are connected with two plugs, each capacitor has a tight cross-linking formation. As a result, the overlapping area of the first electrode and the second electrode is enlarged in per unit volume of the capacitor structure. Thus, the capacitance is increased in per unit volume, or the total layout area can be reduced. In addition, the plugs coupling two layers can reduce the unwanted parasitic resisters and parasitic inductances in the long and narrow metal strips. Consequently, the performance of the capacitor structure is improved. The plugs on the metal strips also help to connect the metal strips in case some particles break the metal strips. Even if few strips are broken, the capacitance value will not be affected greatly, and the yield of the capacitor structure is therefore improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising a conducting array, the conducting array comprising a diagonal-first-major ($D1_+$) first-level array, the $D1_+$ first-level array comprising:
   three first $D1_+$ conductive pieces; and
   a second $D1_+$ conductive piece, two of the first $D1_+$ conductive pieces being disposed in a first row of the $D1_+$ first-level array, the remaining first $D1_+$ conductive piece and the second $D1_+$ conductive piece being disposed in a second row of the $D1_+$ first-level array from left to right, the adjacent first $D1_+$ conductive pieces connecting to each other, the first $D1_+$ conductive pieces not being connected to the second $D1_+$ conductive piece.

2. The capacitor structure of claim 1, wherein the conducting array further comprises a parallel-first-minor ($P1_-$) first-level array, the $P1_-$ first-level array comprising:
   two first $P1_-$ conductive pieces, disposed in a first row of the $P1_-$ first-level array, the adjacent first $P1_-$ conductive pieces connecting to each other, the first $P1_-$ conductive pieces connecting to the adjacent first $D1_+$ conductive pieces; and
   two second $P1_-$ conductive pieces, disposed in a second row of the $P1_-$ first-level array, the adjacent second $P1_-$ conductive pieces connecting to each other, the second $P1_-$ conductive pieces connecting to the adjacent second $D1_+$ conductive pieces, and the first $P1_-$ conductive pieces not being connected to the second $P1_-$ conductive pieces.

3. The capacitor structure of claim 1, wherein the conducting array further comprises a parallel-second-minor ($P2_-$) first-level array, the $P2_-$ first-level array comprising:
   two first $P2_-$ conductive pieces; and
   two second $P2_-$ conductive pieces, one of the second $P2_-$ conductive pieces and one of the first $P2_-$ conductive pieces being disposed in a first row of the $P2_-$ first-level array from left to right, the remaining second $P2_-$ conductive piece and the remaining first $P2_-$ conductive piece being disposed in a second row of the $P2_-$ first-level array from left to right, the adjacent first $P2_-$ conductive pieces connecting to each other, the adjacent second $P2_-$ conductive pieces connecting to each other, the first $P2_-$ conductive pieces connecting to the adjacent first $D1_+$ conductive pieces, the second $P2_-$ conductive pieces connecting to the adjacent second $D1_+$ conductive pieces, and the first $P2_-$ conductive pieces not being connected to the second $P2_-$ conductive pieces.

4. The capacitor structure of claim 1, wherein the conducting array further comprises a diagonal-second-major ($D2_+$) first-level array, the $D2_+$ first-level array comprising:
   a first $D2_+$ conductive piece; and
   three second $D2_+$ conductive pieces, the first $D2_+$ conductive piece and one of the second $D2_+$ conductive pieces being disposed in a first row of the $D2_+$ first-level array from left to right, the remaining two second $D2_+$ conductive pieces being disposed in a second row of the $D2_+$ first-level array, the adjacent second $D2_+$ conductive pieces connecting to each other, and the first $D2_+$ conductive piece not being connected to the second $D2_+$ conductive pieces.

5. The capacitor structure of claim 1, wherein the conducting array further comprises a diagonal-first-minor ($D1_-$) first-level array, the $D1_-$ first-level array comprising:
   three first $D1_-$ conductive pieces; and
   a second $D1_-$ conductive piece, two of the first $D1_-$ conductive pieces being disposed in a first row of the $D1_-$ first-level array, the second $D1_-$ conductive piece and the remaining first $D1_-$ conductive piece being disposed in a second row of the $D1_-$ first-level array from left to right, the adjacent first $D1_-$ conductive pieces connecting to each other, the first $D1_-$ conductive pieces connecting to the adjacent first $D1_+$ conductive pieces, the second $D1_-$ conductive pieces connecting to the adjacent second $D1_+$ conductive pieces, and the first $D1_-$ conductive pieces not being connected to the second $D1_-$ conductive piece.

6. The capacitor structure of claim 1, wherein the conducting array further comprises a diagonal-second-minor ($D2_-$) first-level array, the $D2_-$ first-level array comprising:
   a first $D2_-$ conductive piece; and
   three second $D2_-$ conductive pieces, one of the second $D2_-$ conductive pieces and the first $D2_-$ conductive piece being disposed in a first row of the $D2_-$ first-level array from left to right, the remaining two second $D2_-$ conductive pieces being disposed in a second row of the $D2_-$ first-level array, the adjacent second $D2_-$ conductive pieces connecting to each other, the first $D1_+$ conductive pieces connecting to the first $D2_-$ conductive piece, the second $D1_+$ conductive piece connecting to the second $D2_-$ conductive pieces, and the first $D2_-$ conductive piece not being connected to the second $D2_-$ conductive pieces.

7. The capacitor structure of claim 2 or claim 3, wherein the conducting array comprises four $D1_+$ first-level arrays, six $P1_-$ first-level arrays and six $P2_-$ first-level arrays, one of the $D1_+$ first-level arrays and three of the $P1_-$ first-level arrays being disposed in a first row of the conducting array from left to right, one of the $P2_-$ first-level arrays, one of the $D1_+$ first-level arrays and two of the $P1_-$ first-level arrays being disposed in a second row of the conducting array from left to right, two of the $P2_-$ first-level arrays, one of the $D1_+$ first-level arrays and one of the $P1_-$ first-level arrays being disposed in a third row of the conducting array from left to right, and three of the $P2_-$ first-level arrays and one of the $D1_+$ first-level arrays being disposed in a fourth row of the conducting array from left to right, wherein the conducting array is an L-type layout.

8. The capacitor structure of claim 2, claim 3 or claim 4, wherein the conducting array comprises four $D1_+$ first-level arrays, four $D2_+$ first-level arrays, four $P1_-$ first-level arrays and four $P2_-$ first-level arrays, one of the $D1_+$ first-level arrays, one of the $P1_-$ first-level arrays, one of the $D2_+$ first-level arrays and one of the $P2_-$ first-level arrays being disposed in a first row of the conducting array from left to right, one of the $P2_-$ first-level arrays, one of the $D1_+$ first-level arrays, one of the $P1_-$ first-level arrays and, one of the $D2_+$ first-level arrays being disposed in a second row of the conducting array from left to right, one of the $D2_+$ first-level arrays, one of the $P2_-$ first-level arrays, one of the $D1_+$ first-level arrays and one of the $P1_-$ first-level arrays being disposed in a third row of the conducting array from left to right, and one of the $P1_-$ first-level arrays, one of the $D2_+$ first-level arrays, one of the $P2_-$ first-level arrays and one of the $D1_+$ first-level arrays being disposed in a fourth row of the conducting array from left to right, wherein the conducting array is a ladder type layout.

9. The capacitor structure of claim 2, claim 3, claim 4, claim 5 or claim 6, wherein the conducting array comprises two $D1_+$ first-level arrays, two $D2_+$ first-level arrays, two DL first-level arrays, two $D2_-$ first-level arrays, four $P1_-$ first-level arrays and four $P2_-$ first-level arrays, one of the $D2_+$ first-level arrays, one of the $P2_-$ first-level arrays, one of the $D1_+$ first-level arrays and one of the $P1_-$ first-level arrays being disposed in a first row of the conducting array from left to right, one of the $D1_-$ first-level arrays, one of the $P2_-$ first-level arrays, one of the $D2_-$ first-level arrays and, one of the $P1_-$ first-level arrays being disposed in a second row of the conducting array from left to right, one of the $D2_+$ first-level arrays, one of the $P2_-$ first-level arrays, one of the $D1_+$ first-level arrays and one of the $P1_-$ first-level arrays being disposed in a third row of the conducting array from left to right, and one of the $D1_-$ first-level arrays, one of the $P2_-$ first-level arrays, one of the $D2_-$ first-level arrays and one of the $P1_-$ first-level arrays being disposed in a fourth row of the conducting array from left to right, wherein the conducting array is a zipper type layout.

10. The capacitor structure of claim 2, claim 3, claim 4, claim 5 or claim 6, wherein the conducting array comprises one $D1_+$ first-level array, one $D2_+$ first-level array, two DL first-level arrays, two $D2_-$ first-level arrays, nine $P1_-$ first-level arrays and one $P2_-$ first-level array, the $D2_+$ first-level array, one of the $D2_-$ first-level arrays and two of the $P1_-$ first-level arrays being disposed in a first row of the conducting array from left to right, four of the $P1_-$ first-level arrays being disposed in a second row of the conducting array, one of the $P1_-$ first-level arrays, one of the $D1_-$ first-level arrays, the $D1_+$ first-level array and one of the $P1_-$ first-level arrays being disposed in a third row of the conducting array from left to right, and one of the $D1_-$ first-level arrays, the $P2_-$ first-level array, one of the $D2_-$ first-level arrays and one of the $P1_-$ first-level arrays being disposed in a fourth row of the conducting array from left to right, wherein the conducting array is a hook type layout.

11. The capacitor structure of claim 2, claim 3, claim 4, claim 5 or claim 6, wherein the conducting array comprises two $D1_+$ first-level arrays, two $D2_+$ first-level arrays, two DL first-level arrays, two $D2_-$ first-level arrays, four $P1_-$ first-level arrays and four $P2_-$ first-level arrays, one of the $D1_+$ first-level arrays, one of the $P1_-$ first-level arrays, one of the $D2_+$ first-level arrays and one of the $P2_-$ first-level arrays being disposed in a first row of the conducting array from left to right, one of the $P2_-$ first-level arrays, one of the $D1_+$ first-level arrays, one of the $P1_-$ first-level arrays and, one of the $D2_+$ first-level arrays being disposed in a second row of the conducting array from left to right, one of the $P2_-$ first-level arrays, one of the $D2_-$ first-level arrays, one of the $P1_-$ first-level arrays and one of the $D1_-$ first-level arrays being disposed in a third row of the conducting array from left to right, and one of the $D2_-$ first-level arrays, one of the $P1_-$ first-level arrays, one of the $D1_-$ first-level arrays and one of the $P2_-$ first-level arrays being disposed in a fourth row of the conducting array from left to right, wherein the conducting array is a branch-meander type layout.

12. The capacitor structure of claim 1, wherein the first $D1_+$ conductive pieces are coupled to a first voltage, and the second $D1_+$ conductive piece is coupled to a second voltage.

13. The capacitor structure of claim 1, further comprising a dielectric layer sandwiched between the first $D1_+$ conductive pieces and the second $D1_+$ conductive piece, wherein the dielectric layer comprises silicon oxide, silicon nitride, silicon oxynitride or a combination thereof.

14. The capacitor structure of claim 1, wherein the conducting array comprises metal, polycrystalline silicon or a combination thereof.

15. A capacitor structure, comprising a $D1_+$ block array, the $D1_+$ block array comprising:
a $D1_+$ first-level array, comprising:
three first $D1_+$ lower conductive pieces; and
a second $D1_+$ lower conductive piece, two of the first $D1_+$ lower conductive pieces being disposed in a first row of the $D1_+$ first-level array, the remaining first $D1_+$ lower conductive piece and the second $D1_+$ lower conductive piece being disposed in a second row of the $D1_+$ first-level array from left to right, the adjacent first $D1_+$ lower conductive pieces connecting to each other, the first $D1_+$ lower conductive pieces not being connected to the second $D1_+$ lower conductive piece;
a $D1_+$ second-level array positioned above the $D1_+$ first-level array, comprising:
a first $D1_+$ upper conductive piece; and
three second $D1_+$ upper conductive pieces, the first $D1_+$ upper conductive piece and one of the second $D1_+$ upper conductive pieces being disposed in a first row of the $D1_+$ second-level array from left to right, the remaining two second $D1_+$ upper conductive pieces being disposed in a second row of the $D1_+$ second-level array, the adjacent second $D1_+$ upper conductive pieces connecting to each other, the first $D1_+$ upper conductive piece not being connected to the second $D1_+$ upper conductive pieces; and
a plurality of $D1_+$ contact plugs, coupling the first $D1_+$ lower conductive pieces with the first $D1_+$ upper conductive piece, and coupling the second $D1_+$ lower conductive piece with the second $D1_+$ upper conductive pieces.

16. The capacitor structure of claim 15, wherein one of the $D1_+$ contact plugs, which is positioned corresponding to the first row and a first column of the $D1_+$ first-level array, connects the first $D1_+$ upper conductive piece and one of the first $D1_+$ lower conductive pieces, and one of the $D1_+$ contact plugs, which is positioned corresponding to the second row and a second column of the $D1_+$ first-level array, connects the second $D1_+$ lower conductive piece and one of the second $D1_+$ upper conductive pieces.

17. The capacitor structure of claim 15, further comprising a $P1_-$ block array, the $P1_-$ block array comprising:
a $P1_-$ first-level array, comprising:
two first $P1_-$ lower conductive pieces, disposed in a first row of the $P1_-$ first-level array, the adjacent first $P1_-$ lower conductive pieces connecting to each other; and
two second $P1_-$ lower conductive pieces, disposed in a second row of the $P1_-$ first-level array, the adjacent second $P1_-$ lower conductive pieces connecting to each other, the first $P1_-$ lower conductive pieces connecting to the adjacent first $D1_+$ lower conductive pieces, the second $P1_-$ lower conductive pieces connecting to the adjacent second $D1_+$ lower conductive pieces, and the first $P1_-$ lower conductive pieces not being connected to the second $P1_-$ lower conductive pieces;
a $P1_-$ second-level array positioned above the $P1_-$ first-level array, comprising:
two first $P1_-$ upper conductive pieces; and
two second $P1_-$ upper conductive pieces, one of the second $P1_-$ upper conductive pieces and one of the first $P1_-$ upper conductive pieces being disposed in a first row of the P1_ first-level array from left to right, the remaining second P1_ upper conductive piece and the remaining first P1_ upper conductive piece being disposed in a second row of the P1_ first-level array from left to right, the adjacent first P1_ upper conductive pieces connecting to each other, the adjacent second P1_ upper conductive pieces connecting to each other, the first P1_ upper conductive pieces connecting to the adjacent first $D1_+$ upper conductive pieces, the second P1_ upper conductive pieces connecting to the adjacent second $D1_+$ upper conductive pieces, and the first P1_ upper conductive pieces not being connected to the second P1_ upper conductive pieces; and a plurality of P1_ contact plugs, coupling the first P1_ lower conductive pieces with the first P1_ upper conductive pieces, and coupling the second P1_ lower conductive pieces with the second P1_ upper conductive pieces.

18. The capacitor structure of claim 17, wherein one of the P1_ contact plugs, which is positioned corresponding to the first row and a second column of the P1_ first-level array, connects one of the first P1_ lower conductive pieces and one of the first P1_ upper conductive pieces, and one of the P1_ contact plugs, which is positioned corresponding to the second row and a first column of the P1_ first-level array, connects one of the second P1_ lower conductive pieces and one of the second P1_ upper conductive pieces.

19. The capacitor structure of claim 15, further comprising a P2_ block array, the P2_ block array comprising:

a P2_ first-level array, comprising:
two first P2_ lower conductive pieces; and
two second P2_ lower conductive pieces, one of the second P2_ lower conductive pieces and one of the first P2_ lower conductive pieces being disposed in a first row of the P2_ first-level array from left to right, the remaining second P2_ lower conductive piece and the remaining first P2_ lower conductive piece being disposed in a second row of the P2_ first-level array from left to right, the adjacent first P2_ lower conductive pieces connecting to each other, the adjacent second P2_ lower conductive pieces connecting to each other, the first P2_ lower conductive pieces connecting to the adjacent first $D1_+$ lower conductive pieces, the second P2_ lower conductive pieces connecting to the adjacent second $D1_+$ lower conductive pieces, and the first P2_ lower conductive pieces not being connected to the second P2_ lower conductive pieces;

a P2_ second-level array positioned above the P2_ first-level array, comprising:
two first P2_ upper conductive pieces, disposed in a first row of the P2_ second-level array, the adjacent first P2_ upper conductive pieces connecting to each other; and
two second P2_ upper conductive pieces, disposed in a second row of the P2_ second-level array, the adjacent second P2_ upper conductive pieces connecting to each other, the first P2_ upper conductive pieces connecting to the adjacent first $D1_+$ upper conductive pieces, the second P2_ upper conductive pieces connecting to the adjacent second $D1_+$ upper conductive pieces, and the first P2_ upper conductive pieces not being connected to the second P2_ upper conductive pieces; and a plurality of P2_ contact plugs, coupling the first P2_ lower conductive pieces with the first P2_ upper conductive pieces, and coupling the second P2_ lower conductive pieces with the second P2_ upper conductive pieces.

20. The capacitor structure of claim 19, wherein one of the P2_ contact plugs, which is positioned corresponding to the first row and a second column of the P2_ first-level array, connects one of the first P2_ lower conductive pieces and one of the first P2_ upper conductive pieces, and one of the P2_ contact plugs, which is positioned corresponding to the second row and a first column of the P2_ first-level array, connects one of the second P2_ lower conductive pieces and one of the second P2_ upper conductive pieces.

21. The capacitor structure of claim 15, further comprising a parallel-first-major ($P1_+$) block array, the $P1_+$ block array comprising:

a $P1_+$ first-level array, comprising:
two first $P1_+$ lower conductive pieces, disposed in a first row of the $P1_+$ first-level array, the adjacent first $P1_+$ lower conductive pieces connecting to each other; and
two second $P1_+$ lower conductive pieces, disposed in a second row of the $P1_+$ first-level array, the adjacent second $P1_+$ lower conductive pieces connecting to each other, and the first $P1_+$ lower conductive pieces not being connected to the second $P1_+$ lower conductive pieces;

a $P1_+$ second-level array positioned above the $P1_+$ first-level array, comprising:
two first $P1_+$ upper conductive pieces; and
two second $P1_+$ upper conductive pieces, one of the first $P1_+$ upper conductive pieces and one of the second $P1_+$ upper conductive pieces being disposed in a first row of the $P1_+$ first-level array from left to right, the remaining first $P1_+$ upper conductive pieces and the remaining second $P1_+$ upper conductive pieces being disposed in a second row of the $P1_+$ first-level array from left to right, the adjacent first $P1_+$ upper conductive pieces connecting to each other, the adjacent second $P1_+$ upper conductive pieces connecting to each other, and the first $P1_+$ upper units not being connected to the second $P1_+$ upper conductive pieces; and a plurality of $P1_+$ contact plugs, coupling the first $P1_+$ lower conductive pieces with the first $P1_+$ upper conductive pieces, and coupling the second $P1_+$ lower conductive pieces with the second $P1_+$ upper conductive pieces.

22. The capacitor structure of claim 21, wherein one of the $P1_+$ contact plugs, which is positioned corresponding to the first row and a first column of the $P1_+$ first-level array, connects one of the first $P1_+$ lower conductive pieces and one of the first $P1_+$ upper conductive pieces, and one of the $P1_+$ contact plugs, which is positioned corresponding to the second row and a second column of the $P1_+$ first-level array, connects one of the second $P1_+$ lower conductive pieces and one of the second $P1_+$ upper conductive pieces.

23. The capacitor structure of claim 15, further comprising a parallel-second-major ($P2_+$) block array, the $P2_+$ block array comprising:

a $P2_+$ first-level array, comprising:
two first $P2_+$ lower conductive pieces; and
two second $P2_+$ lower conductive pieces, one of the first $P2_+$ lower conductive pieces and one of the second $P2_+$ lower conductive pieces being disposed in a first row of the $P2_+$ first-level array from left to right, the remaining first $P2_+$ lower conductive piece and the remaining second $P2_+$ lower conductive piece being disposed in a second row of the $P2_+$ first-level array from left to right, the adjacent first $P2_+$ lower conductive pieces connecting to each other, the adjacent second $P2_+$ lower conductive pieces connecting to each other, and the first P2₊ lower conductive pieces not being connected to the second P2₊ lower conductive pieces;

a P2₊ second-level array positioned above the P2₊ first-level array, comprising:
two first P2₊ upper conductive pieces, disposed in a first row of the P2₊ second-level array, the adjacent first P2₊ upper conductive pieces connecting to each other; and
two second P2₊ upper conductive pieces, disposed in a second row of the P2₊ second-level array, the adjacent second P2₊ upper conductive pieces connecting to each other, and the first P2₊ upper conductive pieces not being connected to the second P2₊ upper conductive pieces; and a plurality of P2₊ contact plugs, coupling the first P2₊ lower conductive pieces with the first P2₊ upper conductive pieces, and coupling the second P2₊ lower conductive pieces with the second P2₊ upper conductive pieces.

24. The capacitor structure of claim 23, wherein one of the P2₊ contact plugs, which is positioned corresponding to the first row and a first column of the P2₊ first-level array, connects one of the first P2₊ lower conductive pieces and one of the first P2₊ upper conductive pieces, and one of the P2₊ contact plugs, which is positioned corresponding to the second row and a second column of the P2₊ first-level array, connects one of the second P2₊ lower conductive pieces and one of the second P2₊ upper conductive pieces.

25. The capacitor structure of claim 15, further comprising a D2₊ block array, the D2₊ block array comprising:
a D2₊ first-level array, comprising:
a first D2₊ lower conductive piece; and
three second D2₊ lower conductive pieces, the first D2₊ lower conductive piece and one of the second D2₊ lower conductive pieces being disposed in a first row of the D2₊ second-level array from left to right, the remaining two second D2₊ lower conductive pieces being disposed in a second row of the D2₊ second-level array, the adjacent second D2₊ lower conductive pieces connecting to each other, and the first D2₊ lower conductive piece not being connected to the second D2₊ lower conductive pieces;
a D2₊ second-level array positioned above the D2₊ first-level array, comprising:
three first D2₊ upper conductive pieces; and
a second D2₊ upper conductive piece, two of the first D2₊ upper conductive pieces being disposed in a first row of the D2₊ first-level array, the remaining first D2₊ upper conductive piece and the second D2₊ upper conductive piece being disposed in a second row of the D2₊ first-level array from left to right, the adjacent first D2₊ upper conductive pieces connecting to each other, and the first D2₊ upper conductive pieces not being connected to the second D2₊ upper conductive piece; and
a plurality of D2₊ contact plugs, coupling the first D2₊ lower conductive piece with the first D2₊ upper conductive pieces, and coupling the second D2₊ lower conductive pieces with the second D2₊ upper conductive piece.

26. The capacitor structure of claim 25, wherein one of the D2₊ contact plugs, which is positioned corresponding to the first row and a first column of the D2₊ first-level array, connects the first D2₊ lower conductive piece and one of the first D2₊ upper conductive pieces, and one of the D2₊ contact plugs, which is positioned corresponding to the second row and a second column of the D2₊ first-level array, connects the second D2₊ upper conductive piece and one of the second D2₊ lower conductive pieces.

27. The capacitor structure of claim 15, further comprising a D1₋ block array, the DL block array comprising:
a D1₋ first-level array, comprising:
three first D1₋ lower conductive pieces; and
a second D1₋ lower conductive piece, two of the first D1₋ lower conductive pieces being disposed in a first row of the D1₋ first-level array, the second D1₋ lower conductive piece and the remaining first D1₋ lower conductive piece being disposed in a second row of the D1₋ first-level array from left to right, the adjacent first D1₋ lower conductive pieces connecting to each other, the first D1₋ lower conductive pieces being connected to the first D1₊ lower conductive pieces, the second D1₋ lower conductive pieces being connected to the second D1₊ lower conductive pieces, the first D1₋ lower conductive pieces not being connected to the second D1₋ lower conductive piece;
a D1₋ second-level array positioned above the D1₋ first-level array, comprising:
a first D1₋ upper conductive piece; and
three second D1₋ upper conductive pieces, one of the second D1₋ upper conductive pieces and the first D1₋ upper conductive piece being disposed in a first row of the D1₋ second-level array from left to right, the remaining two second D1₋ upper conductive pieces being disposed in a second row of the D1₋ second-level array, the adjacent second D1₋ upper conductive pieces connecting to each other, the first D1₋ upper conductive pieces being connected to the first D1₊ upper conductive piece, and the second D1₋ upper conductive piece being connected to the second D1₊ upper conductive pieces, the first D1₋ upper conductive piece not being connected to the second D1₋ upper conductive pieces; and
a plurality of D1₋ contact plugs, coupling the first D1₋ lower conductive pieces with the first D1₋ upper conductive piece, and coupling the second D1₋ lower conductive piece with the second D1₋ upper conductive pieces.

28. The capacitor structure of claim 27, wherein one of the D1₋ contact plugs, which is positioned corresponding to the first row and a second column of the D1₋ first-level array, connects one of the first D1₋ lower conductive pieces and the first D1₋ upper conductive piece, and one of the D1₋ contact plugs, which is positioned corresponding to the second row and a first column of the D1₋ first-level array, connects the second D1₋ lower conductive piece and one of the second D1₋ upper conductive pieces.

29. The capacitor structure of claim 15, further comprising a D2₋ block array, the D2₋ block array comprising:
a D2₋ first-level array, comprising:
a first D2₋ lower conductive piece; and
three second D2₋ lower conductive pieces, one of the second D2₋ lower conductive pieces and the first D2₋ lower conductive piece being disposed in a first row of the D2₋ second-level array from left to right, the remaining two second D2₋ lower conductive pieces being disposed in a second row of the D2₋ second-level array, the adjacent second D2₋ lower conductive pieces connecting to each other, the first D2₋ lower conductive pieces being connected to the first D1₊ lower conductive piece, and the second D2₋ lower conductive piece being connected to the second D1₊ lower conductive pieces, the first D2_ lower conductive piece not being connected to the second D2_ lower conductive pieces;
a D2_ second-level array positioned above the D2_ first-level array, comprising:
three first D2_ upper conductive pieces; and
a second D2_ upper conductive piece, two of the first D2_ upper conductive pieces being disposed in a first row of the D2_ first-level array, the second D2_ upper conductive piece and the remaining first D2_ upper conductive piece being disposed in a second row of the D2_ first-level array from left to right, the adjacent first D2_ upper conductive pieces connecting to each other, the first D2_ upper conductive pieces being connected to the first $D1_+$ upper conductive pieces, the second D2_ upper conductive pieces being connected to the second $D1_+$ upper conductive pieces, the first D2_ upper conductive pieces not being connected to the second D2_ upper conductive piece; and
a plurality of D2_ contact plugs, coupling the first D2_ lower conductive piece with the first D2_ upper conductive pieces, and coupling the second D2_ lower conductive pieces with the second D2_ upper conductive piece.

30. The capacitor structure of claim 29, wherein one of the D2_ contact plugs, which is positioned corresponding to the first row and a second column of the D2_ first-level array, connects the first D2_ lower conductive piece and one of the first D2_ upper conductive pieces, and one of the D2_ contact plugs, which is positioned corresponding to the second row and a first column of the D2_ first-level array, connects the second D2_ upper conductive piece and one of the second D2_ lower conductive pieces.

31. The capacitor structure of claim 15, wherein the capacitor structure comprises a conducting array having four $D1_+$ block arrays, four P1_ block arrays, four P2_ block arrays, two $P1_+$ block arrays and two $P2_+$ block arrays, one of the $D1_+$ block arrays, one of the P1_ block arrays, one of the $P1_+$ block arrays and one of the P1_ block arrays being disposed in a first row of the conducting array from left to right, one of the P2_ block arrays, one of the $D1_+$ block arrays, one of the P1_ block arrays and one of the $P1_+$ block arrays being disposed in a second row of the conducting array from left to right, one of the $P2_+$ block arrays, one of the P2_ block arrays, one of the $D1_+$ block arrays and one of the P1_ block arrays being disposed in a third row of the conducting array from left to right, and one of the P2_ block arrays, one of the $P2_+$ block arrays, one of the P2_ block arrays and one of the $D1_+$ block arrays being disposed in a fourth row of the conducting array from left to right, wherein the conducting array is an L-type layout.

32. The capacitor structure of claim 15, wherein the capacitor structure comprises a conducting array having four $D1_+$ block arrays, four $D2_+$ block arrays, four P1_ block arrays and four P2_ block arrays, one of the $D1_+$ block arrays, one of the P1_ block arrays, one of the $D2_+$ block arrays and one of the P2_ block arrays being disposed in a first row of the conducting array from left to right, one of the P2_ block arrays, one of the $D1_+$ block arrays, one of the P1_ block arrays and, one of the $D2_+$ block arrays being disposed in a second row of the conducting array from left to right, one of the $D2_+$ block arrays, one of the P2_ block arrays, one of the $D1_+$ block arrays and one of the P1_ block arrays being disposed in a third row of the conducting array from left to right, and one of the P1_ block arrays, one of the $D2_+$ block arrays, one of the P2_ block arrays and one of the $D1_+$ block arrays being disposed in a fourth row of the conducting array from left to right, wherein the conducting array is a ladder type layout.

33. The capacitor structure of claim 15, wherein the capacitor structure comprises a conducting array having two $D1_+$ block arrays, two $D2_+$ block arrays, two D1_ block arrays, two D2_ block arrays, two $P1_+$ block arrays, two $P2_+$ block arrays, two P1_ block arrays and two P2_ block arrays, one of the $D2_+$ block arrays, one of the P2_ block arrays, one of the $D1_+$ block arrays and one of the P1_ block arrays being disposed in a first row of the conducting array from left to right, one of the D1_ block arrays, one of the P2_ block arrays, one of the D2_ block arrays and, one of the $P1_+$ block arrays being disposed in a second row of the conducting array from left to right, one of the $D2_+$ block arrays, one of the P2_ block arrays, one of the $D1_+$ block arrays and one of the P1_ block arrays being disposed in a third row of the conducting array from left to right, and one of the DL block arrays, one of the $P2_+$ block arrays, one of the D2_ block arrays and one of the $P1_+$ block arrays being disposed in a fourth row of the conducting array from left to right, wherein the conducting array is a zipper type layout.

34. The capacitor structure of claim 15, wherein the capacitor structure comprises a conducting array having one $D1_+$ block array, one $D2_+$ block array, two D1_ block arrays, two D2_ block arrays, five $P1_+$ block arrays, four P1_ block arrays and one P2_ block array, the $D2_+$ block array, one of the D2_ block arrays, one of the $P1_+$ block arrays and one of the P1_ block arrays being disposed in a first row of the conducting array from left to right, one of the P1_ block arrays, one of the $P1_+$ block arrays, one of the P1_ block arrays and one of the $P1_+$ block arrays being disposed in a second row of the conducting array from left to right, one of the $P1_+$ block arrays, one of the DL block arrays, the $D1_+$ block array and one of the P1_ block arrays being disposed in a third row of the conducting array from left to right, and one of the D1_ block arrays, the $P2_+$ block array, one of the D2_ block arrays and one of the $P1_+$ block arrays being disposed in a fourth row of the conducting array from left to right, wherein the conducting array is a hook type layout.

35. The capacitor structure of claim 15, wherein the capacitor structure comprises a conducting array having two $D1_+$ block arrays, two $D2_+$ block arrays, two D1_ block arrays, two D2_ block arrays, two $P1_+$ block arrays, two $P2_+$ block arrays, two P1_ block arrays and two P2_ block arrays, one of the $D1_+$ block arrays, one of the P1_ block arrays, one of the $D2_+$ block arrays and one of the P2_ block arrays being disposed in a first row of the conducting array from left to right, one of the P2_ block arrays, one of the $D1_+$ block arrays, one of the P1_ block arrays and, one of the $D2_+$ block arrays being disposed in a second row of the conducting array from left to right, one of the $P2_+$ block arrays, one of the D2_ block arrays, one of the $P1_+$ block arrays and one of the DL block arrays being disposed in a third row of the conducting array from left to right, and one of the D2_ block arrays, one of the P1_ block arrays, one of the DL block arrays and one of the P2_ block arrays being disposed in a fourth row of the conducting array from left to right, wherein the conducting array is a branch-meander type layout.

* * * * *